United States Patent [19]

Mesch et al.

[11] 4,267,003
[45] May 12, 1981

[54] AUTOMATIC SOLAR CELL GLASSING MACHINE AND METHOD

[75] Inventors: Hans G. Mesch, Manhattan Beach; Colin H. Debenham, Oceanside; Robert K. Yasui, Torrance, all of Calif.

[73] Assignee: TRW Inc., Redondo Beach, Calif.

[21] Appl. No.: 66,581

[22] Filed: Aug. 14, 1979

[51] Int. Cl.³ .............................................. B32B 31/00
[52] U.S. Cl. .................................. 156/356; 156/295; 156/362; 156/566
[58] Field of Search ............... 156/356, 357, 362–364, 156/566, 57, 295, 578, 556, 558, 559

[56] References Cited

U.S. PATENT DOCUMENTS

| | | | |
|---|---|---|---|
| 3,480,504 | 11/1969 | Good | 156/356 |
| 3,544,410 | 12/1970 | Best | 156/356 |
| 4,033,809 | 7/1977 | Tipton | 156/57 |
| 4,115,178 | 9/1978 | Cone | 156/295 |
| 4,146,414 | 3/1979 | Stormby | 156/57 |

*Primary Examiner*—David A. Simmons
*Attorney, Agent, or Firm*—John J. Connors; Donald R. Nyhagen

[57] ABSTRACT

Solar cells are glassed mechanically to form solar cell stacks, each having a protective coverslide adhesively bonded to the active face of a solar cell, by relative movement of assembly fixtures past a solar cell dispenser which places a solar cell on each fixture, a following adhesive dispenser which applies adhesive to the active face of each cell, and a final coverslide dispenser which applies a coverslide to each cell to form an adhesively bonded cell stack. The preferred adhesive is a liquid adhesive which is applied to a central region only of each active cell face, then spreads over the entire cell face by capillary flow following application of the cell coverslide, and is finally cured by relative movement of the cell stack through an oven or the like.

23 Claims, 21 Drawing Figures

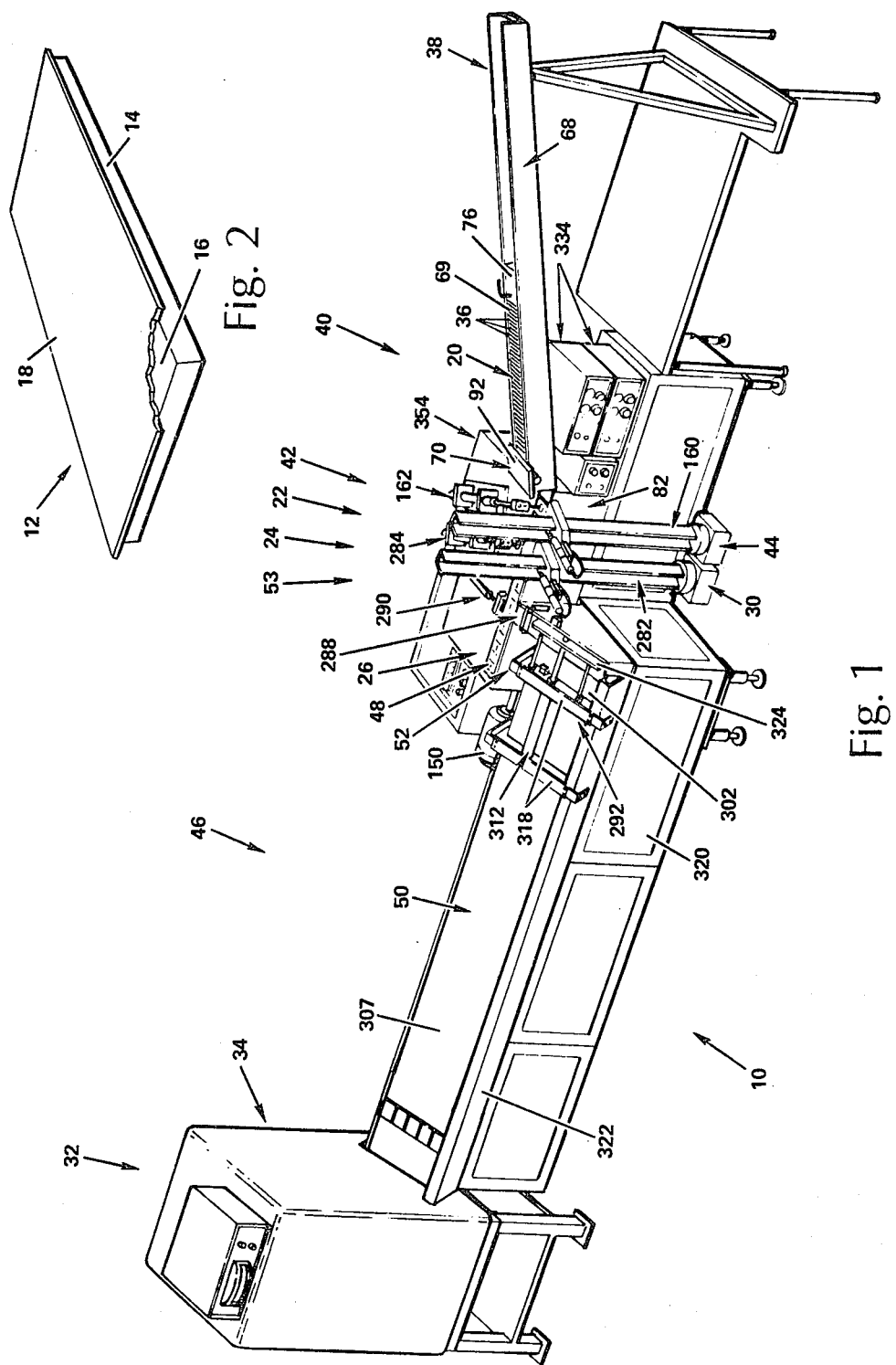

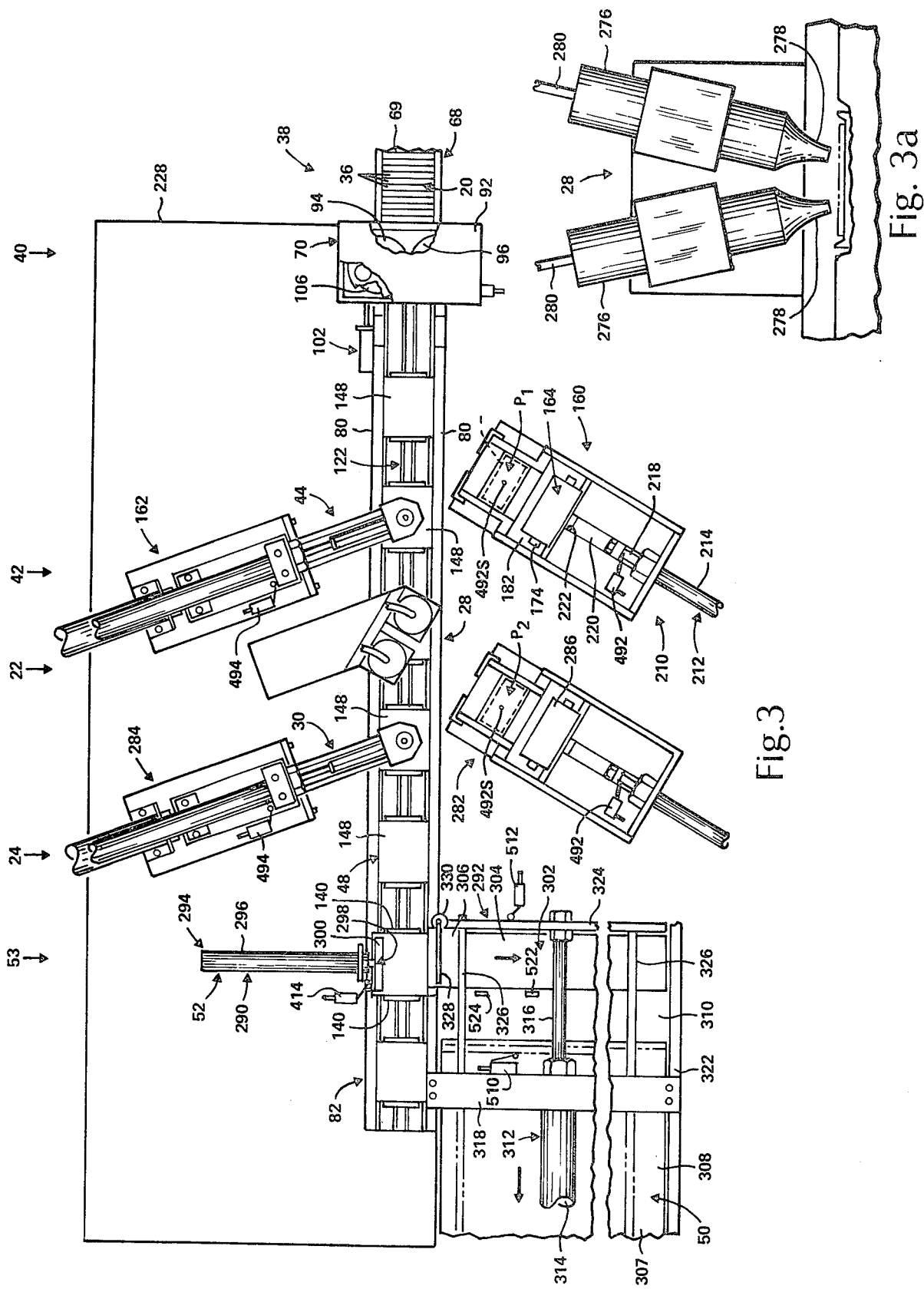

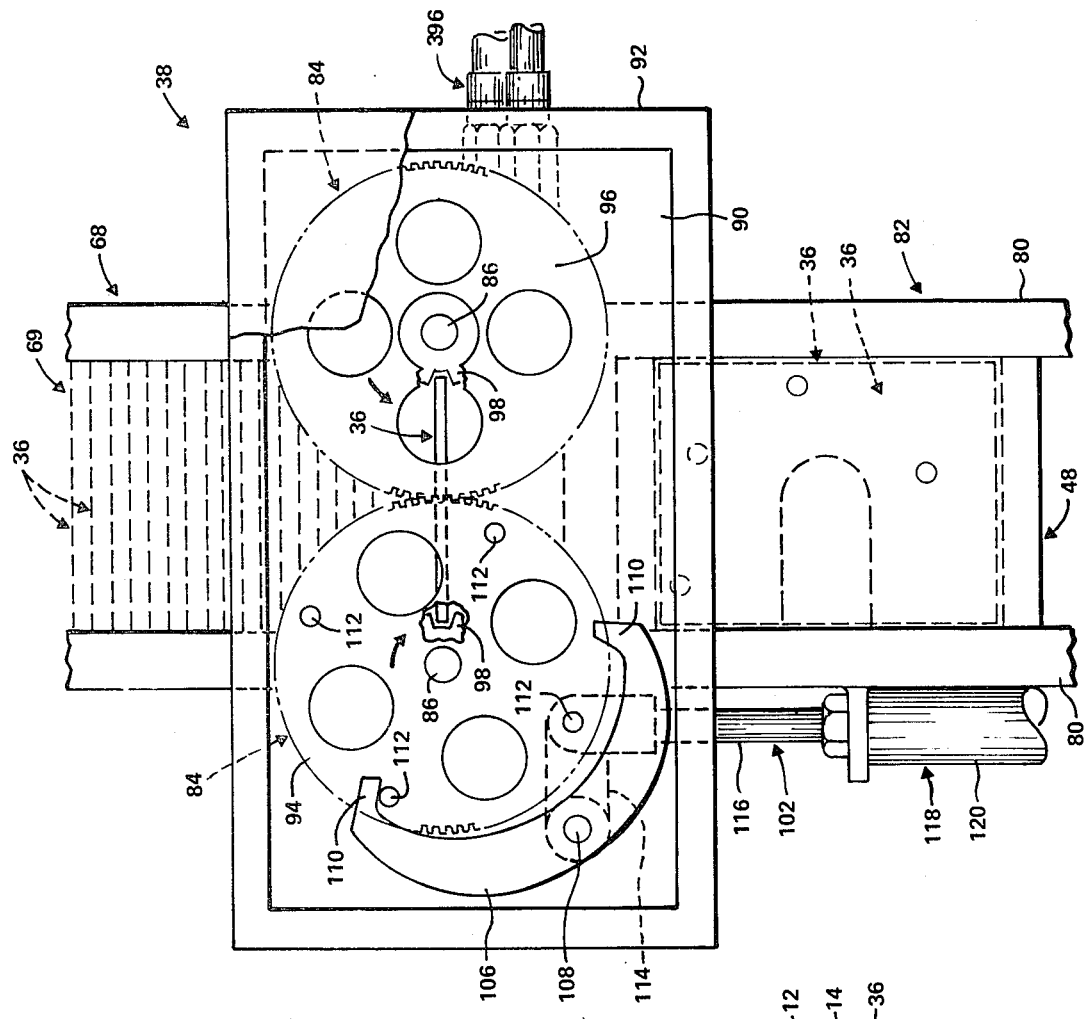
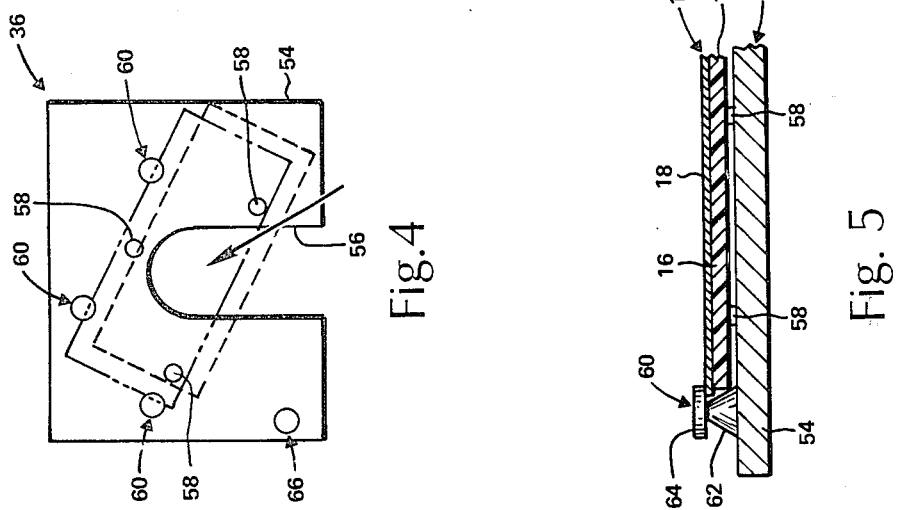
Fig. 6
Fig. 4
Fig. 5

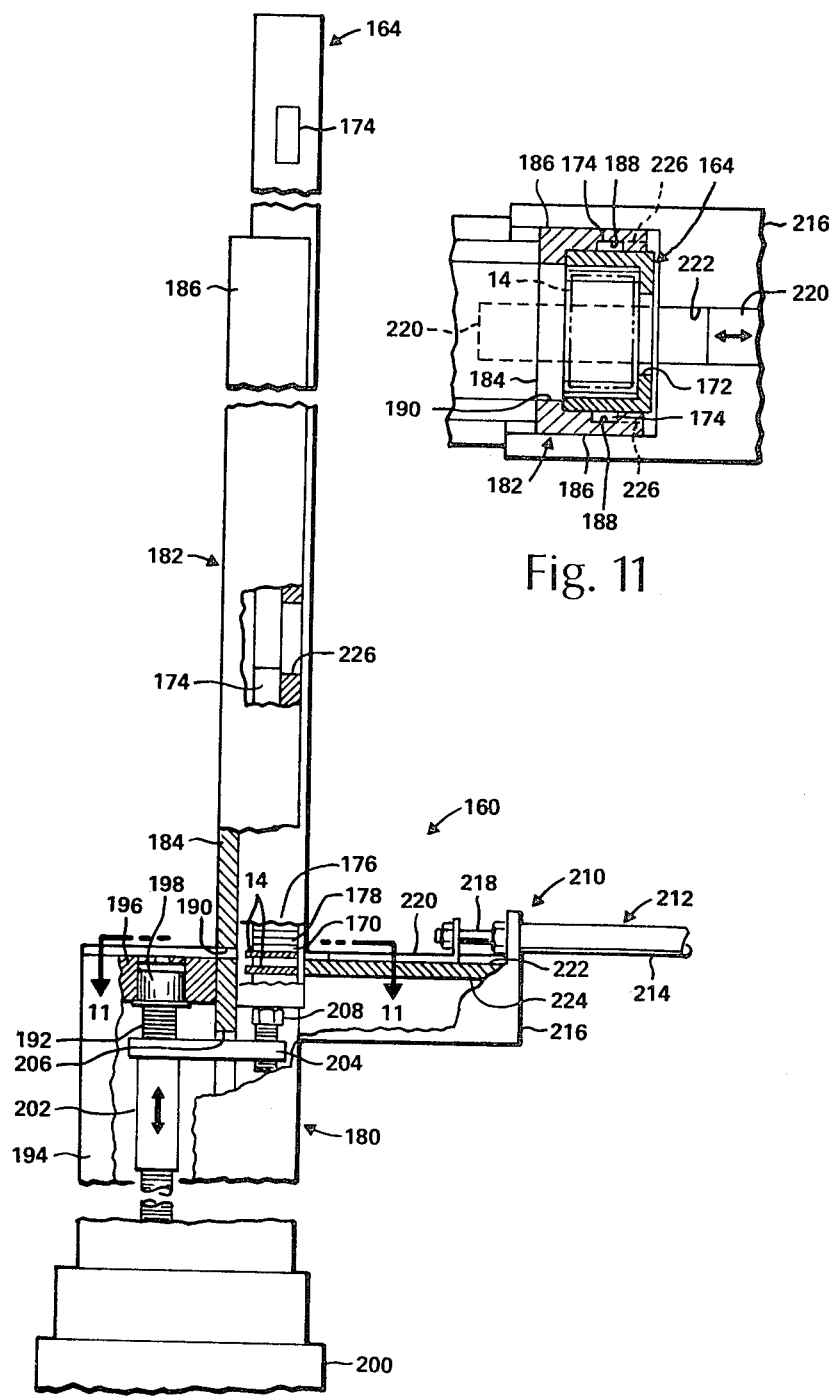

AUTOMATIC SOLAR CELL GLASSING MACHINE AND METHOD

BACKGROUND OF THE INVENTION

The solar cells of solar arrays, particularly those designed for use in the outer space environment, are commonly provided with transparent, wavelength-selective coverslides which are adhesively bonded to the active (light-sensitive) faces of the cells. These coverslides attenuate or block transmission to the underlying solar cells of those light wavelengths which tend to heat the cells and degrade the coverslide adhesive. The coverslides transmit to the solar cells substantially only those wavelengths which are best suited for electrical power generation. The adhesively-bonded assembly, comprising a solar cell and coverslide, is commonly referred to as a glassed solar cell or a solar cell stack.

This invention is concerned with the fabrication of such solar cell stacks and, more particularly, with mechanization of such cell stack fabrication. At the present time, the application of coverslides to solar cells, commonly referred to as "glassing" solar cells, is done manually by highly skilled technicians. These manual cell glassing operations are very tedious, time-consuming and costly, and result in relatively high cell and coverglass breakage rates and a relatively high cell stack rejection rate. This is due in part to the nature of the manual glassing operations themselves and in part to the extremely fragile nature of the solar cells and coverslides. Thus, a typical solar cell for spacecraft solar arrays is on the order of 2 cm by 4 cm in size and 200 microns thick. A typical coverslide is made of fused silica or microsheet glass on the order of 150 microns thick and has substantially the same edge dimensions as the solar cells. Obviously, such thin parts are prone to breakage when manually handled. Proper alignment of the coverslides with the solar cells and adhesive bonding of the slides to the cells are also difficult to accomplish manually and, hence, result in a relatively high cell stack rejection rate.

Another problem encountered in manual fabrication of solar cell stacks involves the properties of the coverslide adhesive. Thus, the coverslide adhesive for a spacecraft solar array must be relatively immune to degradation by the radiation in the space environment, must be capable of retaining its strength over the wide temperature range encountered in the space environment, and must be compatible with the materials to be bonded. Suitable coverslide adhesives are quite costly and shortlived. As a consequence, manual cell stack fabrication is not compatible with such adhesives because the time duration of the manual assembly operations results in substantial wasting of the short-lived adhesives. Accordingly, there is a definite need for an improved method of, and means for, fabricating or assembling solar cell stacks.

SUMMARY OF THE INVENTION

This invention provides a novel solar cell glassing machine and method for fabricating or assembling solar cell stacks of the character described. According to the preferred practice of the invention, the cell stacks are assembled on assembly fixtures by relative movement of these fixtures past a solar cell dispenser, an adhesive dispenser, and a coverslide dispenser in succession. The solar cell dispenser places a solar cell in a predetermined position on each fixture. The adhesive dispenser then applies adhesive to the active (light-sensitive) face of each cell upon its arrival at the dispenser on an assembly fixture. Finally, the following coverslide dispenser applies a coverslide to the adhesive-bearing active face of each solar cell.

The preferred coverslide adhesive is a relatively low viscosity, clear liquid adhesive, such as Dow-Corning adhesive DC 93-500, which is applied to a central region only of each active cell face. When the coverslide is applied to the cell, the adhesive spreads by capillary action over the entire cell face to effect proper adhesive bonding to the coverslide to the cell. Following a time delay sufficient to permit completion of this adhesive spreading action, the adhesive is curved in an oven, or the like.

The presently preferred cell glassing machine has a cell stack assembly conveyor which receives cell stack assembly fixtures in succession from a fixture dispenser having a fixture magazine and conveys the fixtures through solar cell, adhesive, and coverslide dispensing stations located in succession along the conveyor path and containing solar cell, adhesive, and coverslide dispensers, respectively. The conveyor operates intermittently to transport the assembly fixtures through the stations in succession and momentarily arrest each fixture at each station. The solar cell dispenser includes a solar cell dispensing mechanism which dispenses solar cells one by one from a solar cell magazine to an initial infeed position and an infeed mechanism which picks up each cell from this initial position and places the cell in a predetermined position on the assembly fixture currently situated at the solar cell dispensing station. The adhesive dispenser follows the cell dispenser and applies adhesive to the active face of each cell, arriving on its assembly fixture at the adhesive dispensing station. The coverslide dispenser follows the adhesive dispenser and is essentially identical to, and operates in essentially the same manner as, the solar cell dispenser to dispense coverslides one by one from a coverslide magazine to an initial infeed position and then place each slide on the adhesive-bearing face of the solar cell located at the coverslide dispensing station to form a solar cell stack.

After leaving the coverslide dispensing station, each cell stack is conveyed through an adhesive-spreading station to a final curing station containing an oven or the like for curing the coverslide adhesive. The transit time of each cell stack through the adhesive-spreading station is sufficient to permit capillary spreading of the adhesive over the entire face of each solar cell. In the preferred embodiment described, the cell stacks are conveyed through the adhesive spreading and final curing stations on a slowly but continuously moving outfeed conveyor to which the cell stacks are transferred in groups from the intermittent cell stack assembly conveyor. The slow speed of this outfeed conveyor provides the time delay required for complete spreading of the adhesive without an excessive outfeed conveyor length. The transfer of cell stacks in groups from the cell stack assembly conveyor, which moves more rapidly than the outfeed conveyor, to the latter conveyor, compensates for the differing conveyor speeds.

BRIEF DESCRIPTION OF THE DRAWINGS

FIG. 1 is a perspective view of the glassing machine;

FIG. 2 is an enlarged perspective view of a solar cell stack assembled by the machine;

FIG. 3 is an enlarged fragmentary top view of the machine;

FIG. 3a is an enlarged side elevation of an adhesive dispenser of the machine;

FIG. 4 is an enlarged top view of an assembly fixture used in the machine;

FIG. 5 is an enlarged fragmentary section through the fixture with a solar cell and coverglass on the fixture;

FIG. 6 is an enlarged top view of a fixture dispenser embodied in the machine;

FIG. 10 is an enlarged side elevation partly in section, of a solar cell dispenser embodied in the machine;

FIG. 11 is a section taken on line 11—11 in FIG. 10;

DESCRIPTION OF THE PREFERRED EMBODIMENT

Figure 7:
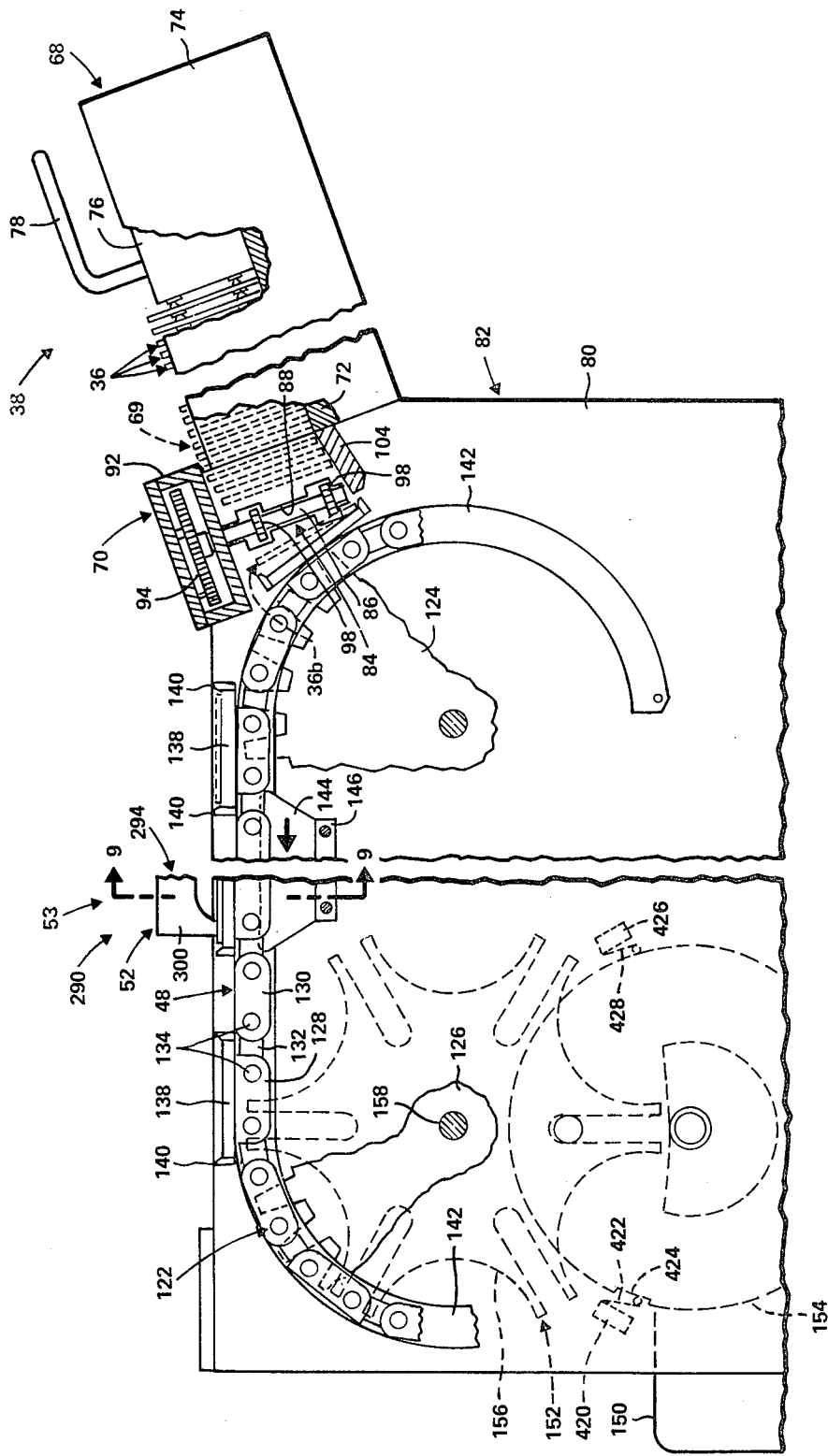
FIG. 7 is an enlarged fragmentary front view of the fixture dispenser and machine conveyor.

According to one of its aspects, the invention provides an automatic solar cell glassing machine 10, illustrated in its entirety in FIG. 1, for producing or assembling glassed solar cells or solar cell stacks of the kind illustrated at 12 in FIG. 2. Cell stack 12 includes a solar cell 14 having an active (light-sensitive) face 16 and a coverslide 18 adhesively bonded to the cell face 16. The dimensions of typical solar cells and coverslides and the wavelength selective characteristics of coverslides for spacecraft solar arrays and the like were discussed earlier and will not be repeated here. The cell stack 12 is conventional and, hence, need not be described further except to say that the coverslide, which has slightly larger edgewise dimensions than the solar cell, is centered on the cell so that the coverslide projects slightly beyond all four edges of the cell, as shown in FIG. 2. A solar array embodying such cell stacks is fabricated by mounting a multiplicity of the stacks on a suitable substrate and electrically joining the solar cells of the stacks in the desired circuit configuration.

As noted earlier, the operation of applying coverslides to solar cells is referred to in the art as a solar cell "glassing" operation. The solar cell glassing machine 10 is designed to perform this cell glassing operation automatically and in a manner which avoids the earlier discussed problems; i.e., high breakage and reject rates, excessive production time, high cost, and excessive adhesive consumption, attendant to manual solar cell glassing operations.

Turning to FIGS. 1 and 3, the solar cell glassing machine 10 comprises, generally speaking, means 20 for receiving solar cells 14 to be glassed, adhesive and coverslide dispensing stations 22, 24, respectively, and means 26 for effecting relative movement of the cell receiving means and the dispensing stations in a manner such that the relative movement of each cell with respect to the dispensing stations occurs through these stations in succession. The adhesive dispensing station 22 contains an adhesive dispenser 28 which applies adhesive to the active face 16 of each solar cell 14. The coverslide dispensing station 24 contains a coverslide dispenser 30 which applies a coverslide 18 to the adhesive-bearing face of each cell to form a solar cell stack 12.

The preferred adhesive for use in the invention is a relatively low viscosity clear liquid adhesive, such as Dow-Corning adhesive DC 93-500. According to the preferred practice of the invention, the adhesive dispenser 28 applies this adhesive to a central region only of each solar cell 14, and curing of the adhesive is delayed following application of the coverslide 18 to the cell sufficiently to permit spreading of the adhesive over the entire cell face by capillary action. After this delay, each cell stack 12 undergoes relative movement through an adhesive curing station 32 containing an adhesive curing means 34, such as an oven, for curing the coverslide adhesive of the cell stack.

In the preferred cell glassing machine 10 illustrated, the solar cell receiving means 20 comprises solar cell assembly fixtures 36 for holding the individual solar cells. These fixtures will be described presently. Suffice it to say here that the means 26 for effecting relative movement of the cell receiving means comprises conveyor means which receives the assembly fixtures 36 in succession from a fixture dispenser 38 located at a fixture dispension station 40 and transports the fixtures first through a solar cell dispensing station 42, then through the adhesive, coverslide, and adhesive curing stations 22, 24, 32, and finally through the adhesive spreading and curing stations 46, 32. Located at the cell dispensing station 42 in solar cell dispenser 44 which places a solar cell 14 in a predetermined position on each assembly fixture 36 upon its arrival at the cell dispensing station.

During operation of the solar cell glassing machine 10, as diagrammatically illustrated in FIG. 15 and explained in more detail later, the assembly fixture dispenser 38 feeds assembly fixtures 36 in succession to the conveyor means 26. This conveyor means transports the fixtures in succession through the solar cell, adhesive, and coverslide dispensing stations 42, 22, 24 to the adhesive curing station 32. At the cell dispensing station 42, each fixture receives a solar cell in a predetermined position from the cell dispenser 44. Each assembly fixture and its solar cell then moves to the adhesive dispensing station 22 where the cell face 16 receives adhesive from the adhesive dispenser 28 and the following coverslide dispensing station 24 where the coverslide dispenser 30 applies a coverslide 18 to the cell to form a cell stack 12. Thereafter, each assembly fixture and its cell stack are transported by the conveyor means 26 to the adhesive curing station 32.

As noted earlier, the preferred coverslide adhesive is a low viscosity liquid adhesive which is applied to a central region only of each solar cell face 16 and then spreads by capillary action over the entire cell face after application of the coverslide 18 to the cell. The illustrated cell glassing machine has an adhesive spreading station 46 through which each solar cell stack 12 and its assembly fixture pass from the coverslide dispensing station 24 to the final adhesive curing station 32. Passage of each stack through this station provides the time delay required to permit spreading of the adhesive over each entire cell face prior to curing of the adhesive. To this end, the conveyor means 26 of the illustrated glassing machine includes an intermittently driven cell stack assembly conveyor 48 for transporting the assembly fixtures 36 one by one in succession through the dispensing stations 42, 22, 24, a continuously driven outfeed conveyor 50 for transporting the fixtures and their cell stacks 12 in groups through the adhesive spreading station 46 and final curing station 32, and transfer means 52 for transferring the fixtures and their cell stacks in groups from the assembly coneyor 48 to the outfeed conveyor 50. As mentioned earlier and described in more detail later, this grouping of the cell stacks and fixtures on the outfeed conveyor compensates for the faster effective speed of the assembly conveyor than the outfeed conveyor.

The illustrated solar cell glassing machine 10 will now be described in more detail. The assembly fixture dispenser 38, which is located at the right-hand infeed end of the machine in FIG. 1, will be described first by reference to FIGS. 3–8.

Turning initially to FIGS. 4 and 5 illustrating one of the assembly fixtures 36, the fixture comprises a relatively thin, flat, rectangular plate 54 containing a slot 56. This slot is located about midway between and parallels two edges of the plate and opens endwise through a third plate edge. The notch provides an access opening to permit gripping of a cell stack 12 on the fixture for removal from the fixture. When assembling a cell stack 12 on the assembly fixture 36 in the manner indicated above and described in more detail presently, a solar cell 14 is placed, face upward, on the fixture plate 54, after which a coverslide 18 is placed on top of the cell, as shown in FIG. 5. Rising slightly above the surface of the fixture plate 54 are upstanding pads 58 which support the solar cell in spaced relation to the plate surface to avoid adhesive bonding of the cell to the plate during cell stack assembly.

Also rising from the fixture plate 54 are three upstanding solar cell and coverslide locating pins 60 for locating a solar cell 14 and coverslide 18 relative to one another and to the assembly fixture 36. Each locating pin 60 has an upwardly narrowing, conically tapered base 62 and a radially projecting top shoulder 64. As will be explained later in connection with the operation of the cell glassing machine, a solar cell 14 and coverslide 18 are placed on each assembly fixture 36 in the position shown in phantom lines in FIG. 4, wherein two intersecting right angle edges of the cell and coverslide engages the three locating pins 60 to position the cell and slide on the fixture and align the cell and slide relative to one another. In connection with this alignment of the solar cell and coverslide, it will be recalled from the earlier discussion relative to FIG. 2 that the coverslide has slightly larger edgewise dimensions than the solar cell and, when properly aligned relative to the cell in the cell stack 12, projects slightly beyond all four cell edges to shield the cell against radiation damage in space.

This alignment of the coverslide relative to the cell with the slide projecting beyond the cell edges, is accomplished by the conical taper of the locating pin bases 62. Thus, as shown in FIG. 5, when the solar cell and coverslide are pressed edgewise against the locating pins 60, as they are in the glassing machine operation, the pin base taper allows the coverslide to project slightly beyond the cell edges. This taper is selected to effect proper alignment of the coverslide and solar cell.

The upper locating pin shoulders 64 hold the coverslide and solar cell against the fixture plate 54.

It will be observed in FIG. 4 that the assembly fixture 36 has a fourth upstanding pin 66 opposite the three locating pins 60. The four pins 60, 66 have the same height and provide a fixture spacing function in the fixture dispenser 38, as explained in the following description of this dispenser.

The assembly fixture dispenser 38 comprises an assembly fixture storage magazine 68 (FIG. 7) containing a stack 69 of assembly fixtures 36 and infeed means 70 for feeding fixtures in succession from the magazine to the cell stack assembly conveyor 48. The fixture magazine illustrated is essentially an inclined chute of channel cross section having a bottom wall 72 and side walls 74. The magazine is open at its top side and its ends. The left and right ends of the magazine, as it is viewed in FIG. 7, are referred to as its front and rear ends, respectively. The magazine slopes upwardly from its front end to its rear end. Positioned in the magazine is a relatively heavy slide 76 with a handle 78 for ease of handling. As explained in more detail presently, this slide presses forwardly against the assembly fixture stack 69 to urge the latter toward the front end of the magazine. This front magazine end is secured in any convenient way to the side walls 80 of the assembly conveyor housing 82, soon to be described.

Figure 8:
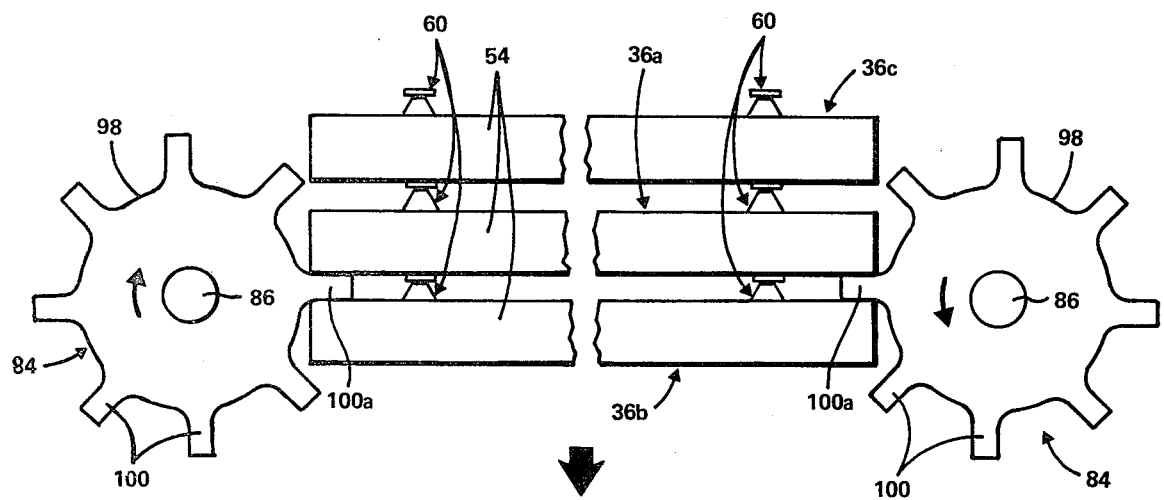
FIG. 8 is an enlarged section through the fixture dispenser.

Referring particularly to FIGS. 6–8, the assembly fixture infeed means 70 is located at the front end of the fixture magazine 68 and comprises a pair of rotary sprocket members 84, each having a shaft 86 disposed within a cutout 88 in one side wall 80 of the assembly conveyor housing 82. Sprocket shafts 86 are disposed in a common plane normal to the longitudinal axis of the fixture magazine. The lower ends of these shafts are journaled in bearings in the conveyor housing side walls 80. The upper shaft ends project into and are journaled in bearings in the lower wall 90 of a housing 92 bridging and secured to the housing side walls 80. Fixed on the upper ends of the sprocket shafts 86 within the housing 92 are meshing pinions 94, 96 which couple the shafts for rotation in unison. Rigid on each sprocket shaft 86 within the conveyor housing wall cutouts 88 and in line with the assembly fixture magazine 68, are a pair of toothed sprockets 98 having teeth 100 shown best in FIG. 8.

Also included in the assembly fixture infeed means 70 is an escapement mechanism 102 for effecting intermittent rotation of the sprocket members 84 in synchronism with motion of the assembly conveyor 48. This escapement mechanism will be described presently. Suffice it to say here that the escapement mechanism operates to alternately restrain the sprocket members 84 against, and release these members for, rotation through a small predetermined angle. When the sprocket members 84 are restrained by the escapement mechanism, teeth on the sprockets 98 are aligned substantially in a common plane containing the sprocket shafts 86, as illustrated by the teeth designated 100a in FIG. 8. Each time it is actuated, the escapement mechanism releases the sprocket members for rotation through an angle, hereinafter referred to as an infeed angle, equal to the angular spacing between the adjacent sprocket teeth 100. During this rotation through the infeed angle, the sprockets 98 rotate from the positions of FIG. 8 to positions where the following sprocket teeth 100 are aligned in the plane of the sprocket shafts.

The assembly fixtures 36 in the stack 69 are arranged with their slots 56 extending normal to the plane of the paper and opening away from the viewer in FIG. 7. The fixture pins 60, 66 project from the rear sides of the fixtures and abut the adjacent rearward fixtures to space the adjacent fixtures in the manner illustrated in both FIGS. 7 and 8. The magazine slide 76 urges the assembly fixture stack 69 forewardly toward the fixture infeed means 70 to a position wherein the leading assembly fixture in the stack, represented by fixture 36a in FIG. 8, abuts the currently aligned infeed sprocket teeth 100a. Fixed between the side walls 80 of the assembly conveyor housing 82 and extending at a slight down angle from the front end of the fixture magazine 68 to the sprocket members 84 is a plate 104 which supports a number of the leading fixtures in the stack.

The combined mass of the slide 76 and stack 69 produce on the sprocket members 84 a moment or torque tending to rotate these members in the directions of the arrows in FIG. 8. The escapement mechanism 102 normally restrains the sprocket members 84 against such rotation and is periodically actuated in synchronism with the assembly conveyor 48, as described below, to release the sprocket members for rotation through one infeed angle.

As shown best in FIG. 8, the sprocket teeth 100 are shaped and sized to straddle the plates 54 of the leading assembly fixtures 36 in the fixture stack 69 in such a way that each rotation of the sprocket members through their infeed angle releases one assembly fixture from the fixture magazine 68 to the assembly conveyor 48. In the drawings, reference numeral 36b denotes an assembly fixture which has thus been released to the assembly conveyor. This conveyor and the manner in which each assembly fixture enters the conveyor will be described presently.

The fixture infeed escapement mechanism 102 is best shown in FIG. 6. This escapement comprises an arcuate escapement pawl 106 located within the escapement housing 92 adjacent the sprocket shaft pinion 94. The pawl is fixed between its ends to a pivot shaft 108 which is journaled in and extends downwardly through and below the bottom wall 90 of the escapement housing. The ends of the pawl turn inwardly over the pinion 94 to form pawl teeth 110 for engaging upstanding escapement pins 112 equally spaced about the pinion.

Rigid on the lower end of the pawl shaft 108 is a radial arm 114. The outer end of this arm is pivotally attached to the end of the plunger 116 of a linear actuator 118. Actuator 118 has a cylinder 120 in which the plunger 116 is movable back and forth and which is mounted in any convenient way on the rear side wall 80 of the assembly conveyor housing 82. As explained in more detail presently, the escapement actuator 118 is activated periodically in synchronism with the assembly conveyor 48 to oscillate the escapement pawl 106 in timed relation to the conveyor movement. During this oscillation, the pawl cooperates with the escapement pins 112 on the sprocket shaft pinion 94 to intermittently release the assembly fixture infeed sprocket members 84 for rotation through an infeed angle under the action of the torque produced on these members by the combined weight of the assembly fixture stack 69 and its backup slide 76. From this description, it will be understood that the escapement actuator 118 is operable to dispense assembly fixtures 36 one by one from the fixture magazine 68 to the cell stack assembly conveyor 48 in synchronism with the conveyor movement.

This cell stack assembly conveyor 48 will now be described by reference to FIGS. 3, 7 and 9. The conveyor comprises an endless conveyor sprocket chain 122 located between the side walls 80 of the assembly conveyor housing 82 and trained about sprocket wheels 124, 126 rotatably mounted within the ends of the housing. Convenyor chain 122 has alternating outer links 128, 130 pivotally joined by intervening links 32 and pivot pins 134. Links 128 are adapted to carry the cell stack assembly fixtures 36 dispensed to the conveyor from the fixture dispensing means 38. To this end, these links have outturned flanges 136 along their upper edges to which are secured conveyor plates 138. Along the end edges of each conveyor plate 138 relative to the endwise direction of the conveyor chain 122 are upstanding shoulders 140. The conveyor plates project laterally beyond the outer edges of the link flanges 136 and have their side edges in close proximity to the conveyor housing side walls 80.

Figure 9:
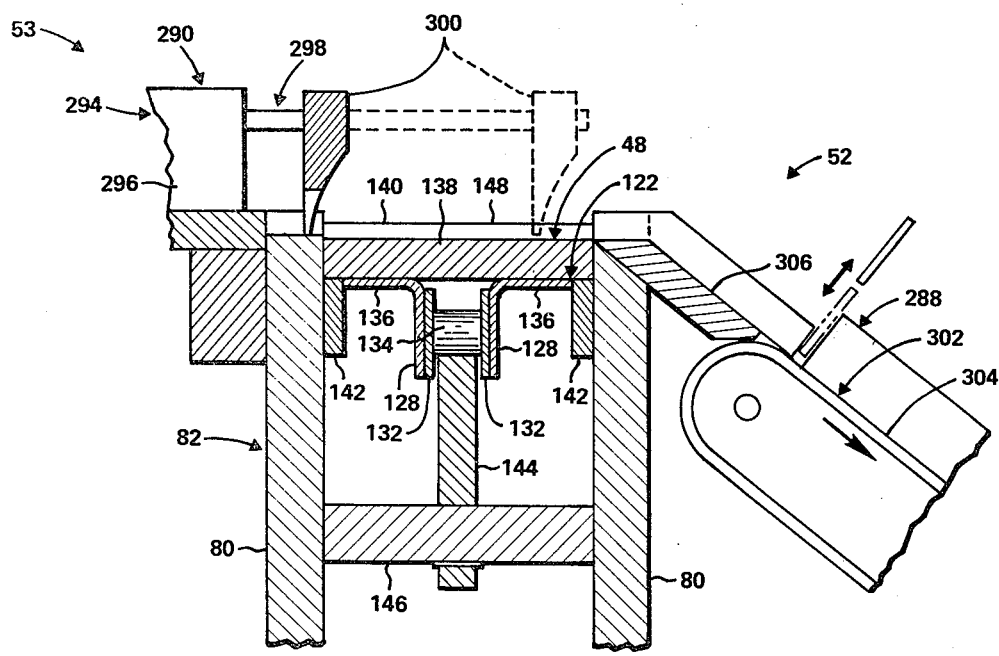
FIG. 9 is an enlarged section taken on line 9—9 in FIG. 7.

As may be best observed in FIG. 9, the laterally projecting sides of the conveyor plates 138 are slidably engagable with conveyor guides 142 secured to the confronting inner sides of the conveyor housing side walls 80. Guides 142 have straight portions along and parallel to the upper edges of the side walls and curved end portions about and concentric with the sprocket wheels 124, 126. An additional linear chain guide rail 144 extends along the top side of the conveyor housing 82 midway between the housing side walls 80. This guide rail is secured along its lower edge to a cross plate 146 which is joined to the side walls as shown. The guide rail projects between the conveyor chain links 128, 130, 132 into supporting contact with roller sleeves on the chain pivots 134.

The cell stack assembly conveyor 48 has an upper run just below and parallel to the top edges of the conveyor housing side walls 80. Each conveyor plate 138 along this upper conveyor run and its end shoulders 140 form an upwardly opening cup 148 for receiving a cell stack assembly fixture 36 in the manner to be described presently. These conveyor cups open laterally off the assembly conveyor 48. As shown best in FIG. 9, the upper edges of the assembly conveyor housing side walls 80 project above the conveyor plates 138 on the upper conveyor run and close the open sides of the conveyor cups 148.

The right hand conveyor sprocket wheel 124 in FIG. 7 is an idler sprocket. The left hand sprocket wheel 126 is a drive sprocket. Drive sprocket 126 is driven from a motor 150 through a Geneva mechanism 152 at the rear side of the conveyor housing 82. Geneva mechanism 152 is conventional and, hence, need not be described in elaborate detail. Suffice it to say that the mechanism includes a disc-shaped driving member 154 driven by the motor 150 and a driven member 156. This driven member and the conveyor sprocket wheel 126 are fixed to a common shaft 158, whereby the motor 150 drives the latter sprocket wheel and, hence, the assembly conveyor chain 122 through the Geneva mechanism 152. This Geneva mechanism operates in the well-known way to cause intermittent motion of the conveyor chain. The resulting intermittent motion of the upper chain run occurs from right to left in FIG. 7, as indicated by the arrow.

It will be observed in FIG. 7 that the intermittent motion of the assembly conveyor chain 122 occurs past the assembly fixture dispenser 38 as the chain travels around the idler sprocket wheel 124. This intermittent motion occurs in such a way that the conveyor cups 148 are aligned with the fixture dispenser in succession and each cup is arrested in the position of the right hand cup of FIG. 7, wherein the cup is disposed to receive a cell stack assembly fixture 36 from the dispenser in the manner depicted by the fixture 36b in the FIG. As will be explained in detail presently, the escapement mechanism 102 of the fixture dispenser 38 is operated periodically in synchronism with the intermittent motion of the assembly conveyor 48 to dispense an assembly fixture 36 to each conveyor cup 148 when the latter is arrested opposite the dispenser. The fixture drops into the cup in the manner depicted in FIG. 9, and is then transported along the upper run of the conveyor 48 in succession through and is momentarily arrested with the conveyor at the solar cell dispensing station 42, the adhesive dispensing station 28, the coverslide dispensing station 24, and the cell stack transfer station 53. From the earlier description of the fixture dispenser, it will be understood that each fixture enters the conveyor with the fixture slot 56 extending transverse to the direction of conveyor movement and opening toward the rear side of the conveyor.

As noted earlier, the solar cell dispensing station 42 has a solar cell dispenser 44 for feeding solar cells 14 in succession to the cell stack assembly conveyor 48. This cell dispenser will now be described by reference to FIGS. 1, 3 and 10–14.

Cell dispenser 44 comprises a solar cell dispensing means 160 proper which dispenses cells 14 in succession to an initial cell infeed position P, and a cell transfer means 162 for transferring each cell from the initial infeed position to the conveyor 48. The cell dispensing means 160 is located at one side of the conveyor 48 and the transfer means 162 is located at the opposite side of the conveyor.

Figure 12:
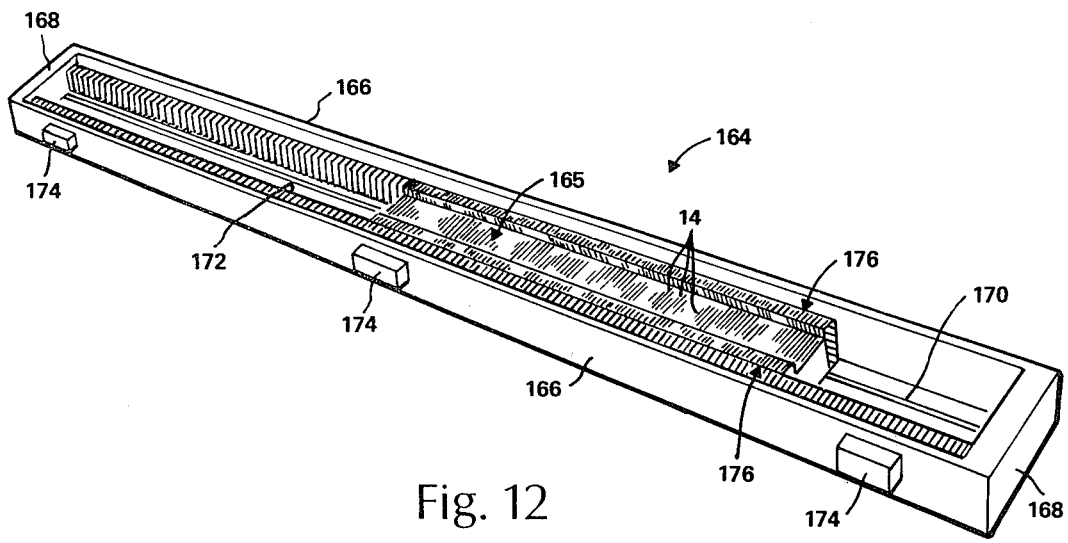
FIG. 12 is an enlarged perspective view of a solar cell storage magazine embodied in the machine.
Figure 13:
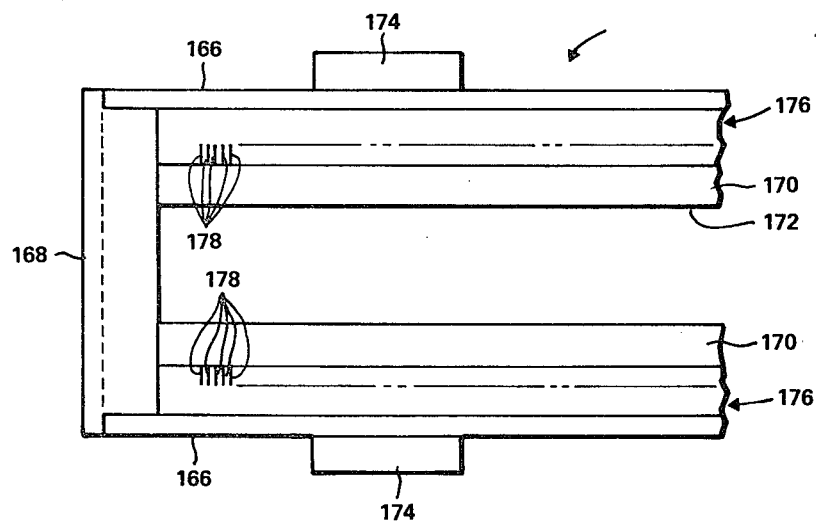
FIG. 13 is an enlarged fragmentary front view of the magazine.

Cell dispensing means 160 comprises a solar cell magazine 164 shown in enlarged detail in FIGS. 12 and 13 and containing a column 165 of solar cells 14. This magazine has a long, narrow, rectangular tray-like configuration including side and end walls 166, 168 and inwardly directed shoulders 170 along two corresponding edges of the side walls 166. These shoulders are spaced to form an intervening slot 172 extending lengthwise of the magazine, midway between its side walls 166. The side of the cell magazine at which the shoulders 170 are located is referred to as its rear side. The opposite side of the magazine is totally open and is referred to as its front side. Projecting from the outer sides of the magazine side walls 166 are rectangular lugs 174. Fixed within the magazine along its two side wall shoulders 170 are solar cell holders 176 containing narrow slits 178. These slits are arranged in pairs disposed in common planes normal to and spaced uniformly along the length of the magazine; i.e., each slit in one cell holder is aligned in a common plane normal to the length of the magazine with a corresponding slit in the other holder to form a slit pair. Each slit pair is adapted to receive a solar cell 14 with the cell ends fitting slidably in the two slits of the pair and seating against the magazine shoulders 170 and the cell extending across the magazine slot 172. This magazine is thus adapted to hold a column 165 of solar cells disposed side by side as shown in FIG. 12.

In addition to the solar cell magazine 164, the solar cell dispensing means 160 includes a cell dispensing mechanism 180 for dispensing cells 14 in succession from the magazine to the initial cell infeed position $P_1$ in FIG. 3. This cell dispensing mechanism has an upstanding magazine guide 182 of generally channel cross section including a front wall 184 facing the cell stack assembly conveyor 48 and rearwardly directed side walls 186. As best shown in FIGS. 10 and 11, guide 182 is internally sized to slidably receive the magazine 164 endwise with the magazine lugs 174 lugging in longitudinal grooves 188 in the inner sides of the guide side walls 186. The magazine is positioned in the guide with the open front side of the magazine facing the front wall 184 of the guide. The slotted rear side of the magazine is exposed through the open rear side of the guide. The upper end of the guide is open, whereby the magazine may project above the guide, as shown. Opening through the front guide wall 184 approximately at the level of the upper run of the solar cell stack assembly conveyor 48 is a slot 190 through which solar cells 14 are ejected from the cell magazine 164 to the initial infeed position $P_1$, as described later.

Located in front of the solar cell magazine guide 182 and extending lengthwise of the guide between its front wall slot 190 and its lower end, is a lead screw 192. This lead screw is enclosed in a housing 194 secured to the guide 182 and having a top wall 196 whose upper surface is flush with the bottom surface of the slot 190. Lead screw 192 is rotatably supported at its upper end by a bearing 198 in the housing wall 196 and, at its lower end, by a bearing (not shown). At the lower end of the magazine guide 182 and lead screw housing 194 is a reversible motor 200 for driving the lead screw in either direction of rotation. Threaded on the lead screw 192 is a nut 202 having a radial arm 204 extending through a longitudinal slot 206 in front wall 184 of the magazine guide 182, approximately coextensive with the lead screw. The arm 204 fits quite closely within the slot 206, whereby the nut 202 is restrained against turning with the lead screw 192. Accordingly, rotation of the lead screw by its motor 200 drives the nut up or down, depending upon the direction of lead screw rotation. Theaded in the end of the arm 204, within and parallel to the length of the cell magazine guide 182, is a set screw 208 which supports the cell magazine 164 in the guide, as shown.

From the description to this point of the solar cell dispensing means 160, it will be understood that when positioned in the dispenser guide 182, the solar cell magazine 164 is vertically supported on and moves vertically with the lead screw nut 202. As will be explained in more detail presently, the nut, and hence the magazine, are initially situated at the lower limit of their vertical movement relative to the guide. This lower position of the magazine is adjusted, by adjustment of the magazine support screw 208, to locate the top solar cell 14 contained in the magazine in the plane of the front slot 190 in the magazine guide. Thereafter, during operation of the solar cell glassing machine, the lead screw motor 200 is operated intermittently in synchronism with the cell stack assembly conveyor 48 to elevate the cell magazine 164 stepwise in such a way as to align in succession the solar cells 14 in the magazine with the guide slot 190.

Located at the rear of the solar cell magazine guide 182 is an ejector 210 for ejecting solar cells 14 from the magazine 164. This ejector comprises a linear actuator 212 including a cylinder 214 mounted on a support 216 secured to and extending rearwardly from the cell magazine guide. Cylinder 214 contains a plunger 218 mounting an ejector blade 220 slidable in a guide channel 222 entering the upper surface of a plate 224 that forms part of the actuator support 216. Ejector blade 220 is longitudinally aligned with the rear slot 172 in the cell magazine 164 and with the magazine guide slot 190. Blade 220 is sized to move back and forth through the magazine and the guide slot between its retracted full line position and its extended broken line position of FIGS. 10 and 11.

Briefly, in operation of the solar cell dispensing means 160, the lead screw 192 is driven intermittently in synchronism with the intermittent motion of the cell stack assembly conveyor 48 to step the solar cell magazine 164 upwardly in the magazine guide 182 to align the succession solar cells 14 in the magazine with the guide slot 190. The cell ejector 210 is operated periodically in timed relation to this stepped evaluation of the magazine to eject the solar cells in succession from the magazine. Thus, each time the magazine is stepped upwardly to align a solar cell with the guide slot 190, the ejector 210 is operated to first extend its ejector blade 220 forwardly to its broken line position and then retract the blade rearwardly to its full line position of FIGS. 10 and 11. During its extension, the blade first engages the rear edge of the aligned solar cell in the magazine 164 through the rear magazine slot 172 and then pushes the cell forwardly from the magazine through the open front side of the magazine and the guide slot 190 to a position (initial infeed position $P_1$) on the top of the lead screw housing wall 196 which forms a supporting platform for the dispensed cell. Along the edges of this platform are side guides 225 for the cell. Each cell is then transferred from this platform to the cell stack assembly conveyor 48 by the solar cell transfer means 162.

The solar cell magazine 164 may be loaded into and removed from the magazine guide 182 either endwise through its open upper end or laterally through its open rear side. Insertion and removal of the magazine through the rear side of the guide is accommodated by rearwardly opening notches 226 in the guide walls 186 which permit passage of the magazine lugs 174 laterally into and from the magazine guide grooves 188.

Figure 14:
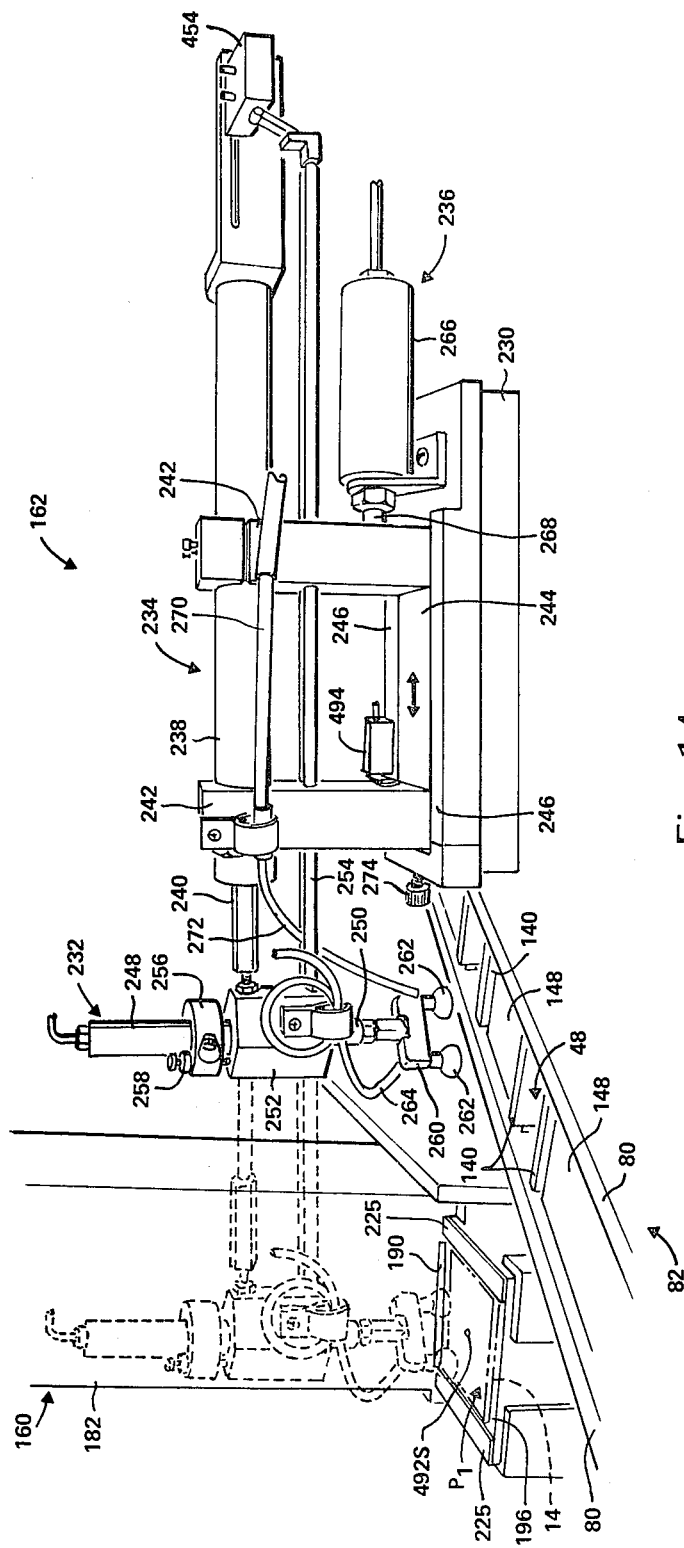
FIG. 14 is an enlarged side elevation of a solar cell transfer means embodied in the machine.

Referring particularly to FIGS. 3 and 14, the solar cell transfer means 162 comprises a suction-type cell pickup and placement mechanism mounted on a supporting platform 228 secured to, and extending rearwardly from the upper edge of the rear 180 of the assembly conveyor housing 82. The cell infeed or pick-up and placement mechanism is located on the opposite side of the assembly conveyor 48 from the cell dispensing means 160 and directly opposite the dispenser, as best shown in FIG. 3.

Cell transfer means 162 has a mounting base 230 firmly attached to the supporting platform 228 and three linear actuators 232, 234, 236. Actuator 232 is a vertical cell pickup and placement actuator for picking up each solar cell 14 from its initial infeed position $P_1$ at the cell dispensing means 160 and then placing the cell on an assembly fixture 36 carried on the assembly conveyor 48. Actuator 234 is a horizontal cell transfer actuator which moves the cell pickup and placement actuator 232 back and forth between the cell dispensing means and the conveyor. Actuator 236 is a cell final positioning actuator which effects final positioning of each solar cell on its assembly fixture.

The horizontal cell transfer actuator 234 has a horizontal cylinder 238 containing a plunger 240. Cylinder 240 is supported by a pair of posts 242 carried by a slide plate 244 on the base 230. Base 230 has guides 246 along the longitudinal edges of the slide plate which guide the plate, and hence the transfer actuator 234, for endwise movement relative to the base and parallel to the axis of cylinder 238, as indicated by the arrow in FIG. 14.

The vertical cell pickup and placement actuator 234 has a vertical cylinder 248 containing a plunger 250 which extends from the lower end of the cylinder. Cylinder 248 is slidable endwise in a holder 252 which is mounted on the end of the transfer actuator plunger 240. Also fixed to this cylinder holder are two guide rows (254) which extend slidably through guide bores in the posts 242 and parallel to the transfer actuator plunger. Fixed to the cell pickup and placement actuator cylinder 248 above its holder 252 is a shoulder ring 256 coupled to the holder by an adjustment screw 258 for axially adjusting the cylinder relative to the holder. Thus, the cell pickup and placement actuator 232 is movable horizontally with, and adjustable vertically relative to, the plunger 240 of the cell transfer actuator 234.

Fixed to the lower end of the plunger 250 of the cell pickup and placement actuator 232 is a crosshead 260 mounting at its underside two suction cups 262. Leading from the crosshead is a hose 264 which communicates with the suction cups 262 and through which the cups may be evacuated and pressurized, as described later. Plunger 250 is keyed against rotation about its longitudinal axis to retain the crosshead 260 and suction cups 262 at the angle shown relative to the axis of the transfer actuator 234. The cell positioning actuator 236 has a cylinder 266 fixed to the base 230 rearwardly of the slide plate 244. Movable in this cylinder is a plunger 268 which is fixed to the adjacent slide plate post 242, whereby movement of the plunger moves the cell transfer actuator 234 and the cell pickup and placement actuator 232 as a unit back and forth in the axial direction of the transfer actuator.

Fixed to the forward cylinder support post 242 is an air hose 270. A nozzle tube 272 extends from this air hose downwardly toward the cell stack assembly conveyor 48. As will be explained, during operation of the solar cell glassing machine air blasts are directed toward the conveyor through the nozzle tube to hold solar cells on the conveyor.

The solar cell transfer actuator 234 is operable to extend and retract the cell pickup and placement actuator 232 between its broken line cell pickup position and its solid line cell placement position of FIG. 14. In its extended cell pickup position, the pickup and placement actuator is located directly over the initial cell infeed position $P_1$. In its retracted cell placement position, the actuator is located directly over the assembly conveyor 48. This conveyor is so constructed and arranged that during its intermittent motion, discussed earlier, its assembly fixture receiving cups 148 are momentarily arrested in succession in a solar cell receiving position at the cell dispensing station 42, wherein each cup is situated directly under the cell pickup and placement actuator 232 when the latter occupies its solid line retracted cell placement position of FIGS. 3 and 14.

Briefly, in operation of the solar cell transfer means 162, the cell transfer actuator 234 operates to horizontally extend and retract the cell pickup actuator 232 between its broken line cell pickup position and its full line cell placement position of FIG. 14 in synchronism with the operation of the cell dispensing means 160 and the cell stack assembly conveyor 48. While the cell pickup actuator 232 is in its extended cell pickup position, its plunger 250 is extended downardly to press the suction cups 262 against the solar cell 14 downwardly to press the suction cups 262 against the solar cell 14 currently in the initial infeed position $P_1$ on the cell dispenser platform 196. These cups are then evacuated, and the plunger 250 is retracted upwardly to lift the cell from the cell dispenser platform 196. Following subsequent horizontal retraction of the actuator 232 to its solid line cell placement position of FIG. 14, the actuator plunger 250 is extended downwardly to place the solar cell in an initial position, shown in dotted lines in FIG. 4, on the assembly fixture 36 contained in the underlying fixture cup 148 of the assembly conveyor 48. In this initial position, the cell clears the shoulders 64 of the cell locating pins 60 on the fixture. The cell positioning actuator 236 is then operated to effect final edgewise positioning of the cell against the assembly fixture locating pins 60 below their shoulders 64, as shown in phantom lines in FIG. 4 and explained more fully below. At this point, the suction cups 262 are pressurized, an air jet is directed against the cell through the air nozzle 272, and the plunger 250 of the cell pickup and placement actuator 232 is retracted upwardly, leaving the solar cell on the underlying assembly fixture 36.

Concerning this placement of solar cells 14 on a cell stack assembly fixture 36, as just noted, the dotted lines in FIG. 4 represent the initial position in which a cell is placed on the fixture during the above described operation of the solar cell transfer means 162. This initial placement of the cell on the fixture is is necessary to clear the shoulders 64 on the fixture locating pins 60. The phantom lines depict the final position of the cell against the cell locating pins 60 below their shoulders 64. This final positioning of the cell is accomplished by operation of the cell positioning actuator 236 which shifts the cell edgewise along the fixture 36 in the direction of the arrow in FIG. 4 to the final position shown wherein the left-hand cell edge in the figure abuts the left-hand locating pin and the upper cell edge in the figure abuts the remaining two locating pins. These pins are situated to locate the cell in a predetermined position (i.e., the phantom line position) on the fixture.

As noted earlier, the cell positioning actuator 236 which accomplishes this final positioning of each solar cell 14 on its assembly fixture 36, operates to move the cell transfer actuator 234 and cell pickup actuator 236 as a unit back and forth in the direction of the arrow in FIG. 14. The solar cell dispensing means 44 is so constructed and arranged that this movement of actuators 234, 236 shifts the cell edgewise from its dotted line position to its phantom line position of FIG. 4. Thus, in the particular cell glassing machine illustrated, each cell occupies a diagonal position on its assembly fixture and the locating pins 60 are arranged to align the cell in this diagonal position. The solar cell dispensing means 160 and cell transfer means 162 are angled as shown relative to the assembly conveyor 48, such that these means coact to place each solar cell at the proper angle on its assembly fixture. The cell positioning actuator 236 operates to move the cell pickup and transfer actuators 232, 234 in a direction (i.e., the direction of the arrow in FIG. 14) which parallels the direction in which each solar cell is shifted from its initial position to its final position on its assembly fixture (i.e., the direction of the arrow in FIG. 4). Each cell is thus placed on its assembly fixture 36 at an angle such that movement of the cell pickup and transfer actuators 232, 234 by the cell positioning actuator 236 in the direction of the arrow in FIG. 14 is effective to force the cell edgewise against the fixture locating pins 60 to locate the cell in its final phantom line position of FIG. 4. The cell transfer means has an adjustable stop 274 to limit movement of the cell pickup and transfer actuators by the cell positioning actuator to the proper distance for final cell positioning.

From this description, it will be understood that the cell dispensing means 160 operates to dispense solar cells 14 in succession from the cell magazine 164 to the initial infeed position $P_1$. The cell pickup and placement actuator 232 is extended horizontally to its broken line cell pickup position of FIG. 14 and its plunger 25 is then extended and retracted vertically while its suction cups 262 are evacuated to pick up each solar cell from the position $P_1$. The actuator 232 is then retracted horizontally to its solid line cell placement position of FIG. 14, after which its plunger is extended to place the cell in its initial position on the underlying solar cell stack assembly fixture 36. The cell positioning actuator 236 then extends to shift the cell to its final position against the fixture locating pins 60, the suction cups 262 are pressurized, an air blast is directed against the cell through air nozzle 272, and the cell positioning and cell pickup and placement actuators are retracted to complete the cell dispensing placement cycle.

The next intermittent motion of the assembly conveyor 48 transports the solar cell 14 on its assembly fixture 36 to the following adhesive dispensing station 22 where the cell and fixture are again momentarily arrested with the conveyor. The adhesive dispenser 28 located at this station operates to apply adhesive to the solar cell.

The adhesive dispenser 28 illustrated comprises a pair of adhesive containers 276 with lower dispensing spouts 278. These containers are periodically pressurized through air tubes 280 in the manner explained later to dispense a small drop of glue onto the cell through each spout 278. As noted earlier, the preferred adhesive is a relatively low viscosity liquid adhesive such as Dow-Corning adhesive DC 95-500.

The next intermittent motion of the assembly conveyor 48 transports the adhesive bearing solar cell 14 and its supporting assembly fixture 36 to the coverslide dispensing station 24 where the cell is again momentarily arrested. At this station, the coverslide dispenser 30 applies a coverslide 24 to the upper adhesive bearing surface of the cell and positions the coverslide edgewise against the fixture locating pins 60 to align the coverslide relative to the cell. In this regard, it will be recalled from the earlier discussion concerning FIG. 2 that the coverslide has slightly larger edgewise dimensions than the cell and is centered relative to the cell so that the coverslide edges project slightly beyond the cell edges to shield the cell against radiation damage in space. As will be explained presently, the fixture locating pins 60 accomplish this centering of the coverslide relative to the cell.

The coverslide dispenser 30 is identical to, and operates in precisely the same way as, the solar cell dispenser 44. Accordingly, it is unnecessary to describe the coverslide dispenser in complete detail. Suffice it to say that the coverslide dispenser includes a coverslide dispensing means 282 proper and a coverslide transfer means 284. The dispensing means 282 dispenses coverslides 24 in succession from a coverslide magazine 286 to an initial infeed position $P_2$. The coverslide transfer means 284 picks up each coverslide from the position P₂, transports the coverslide to and places the coverslide in an initial position (corresponding to the initial cell position of FIG. 4) on the adhesive bearing solar cell currently situated at the coverslide dispensing station 24, and finally shifts the coverslide edgewise against the locating pins 60 of the assembly fixture 36 supporting the cell to form a solar cell stack 12.

At this point, attention is directed to FIG. 5, illustrating the manner in which the fixture locating pins 60 position the solar cell 14 and coverslide 18 of each cell stack 12 relative to one another. Thus, the solar cell contacts the base of each pin and the coverslide contacts a midsection of each pin. Because of the pin taper, the base of each pin has a larger diameter than the pin midsection with the result that the coverslide is positioned relative to the cell with the respective coverslide edge projecting beyond the adjacent cell edge. This pin taper is selected to center the coverslide on the solar cell with all four coverslide edges projecting equally beyond the cell edges, as shown in FIG. 2. The locating pin shoulders 64 hold the cell stack downwardly on the assembly fixture 36.

During its intermittent motion following placement of the converslide 18 on the solar cell 14, the assembly conveyor 48 transports the resulting solar cell stack 12 and its supporting fixture 36 to the conveyor transfer station 53, whereupon the conveyor is again momentarily arrested. The cell stack and its assembly fixture are then transferred from the assembly conveyor, which moves with a relatively rapid, intermittent motion, to the outfeed conveyor 50, which moves with a relatively slow continuous motion, by the conveyor transfer means 52. The purpose of this transfer is to provide a sufficient time delay before passage of the cell stack through the adhesive curing station 32 sufficient to enable spreading of the coverslide adhesive by capillary action over the entire solar cell face, as discussed in more detail below.

Referring to FIGS. 1, 3, 7 and 9, the conveyor transfer means 52 comprises a downwardly inclined ramp 288 extending laterally from the assembly conveyor 48 at the transfer station 53, a cell stack ejector 290 for ejecting cell stacks 12 in succession from the assembly conveyor onto the ramp in such a way that the stacks collect in groups on the ramp, and means 292 for transferring each such cell stack group from the ramp to the outfeed conveyor 50. This transfer of the cell stacks to the outfeed conveyor in groups compensates for the relatively slow rate of movement of this conveyor compared to that of the assembly conveyor 48, which is necessary to provide the time delay required for complete capillary spreading of the coverslide adhesive.

The cell stack ejector 290 comprises a linear actuator 294 including a cylinder 296 mounted on the assembly conveyor platform 228 at the rear side of the assembly conveyor 48 and a plunger 298 movable in the cylinder. Plunger 298 mounts a cell stack ejector plate 300 at its outer end. Plunger 298 is normally retracted to its rear solid line position of FIG. 9 wherein the ejector plate 300 clears the assembly conveyor 48 and is extendable horizontally across the conveyor to its broken line position of FIG. 9. The plunger is thus extended and then retracted each time a solar cell stack 12 is arrested at the transfer station 53. During this extension of the plunger, its ejector plate 300 moves laterally across the assembly conveyor cup 148 currently located at the station and pushes its contained cell stack 12 onto the ramp 288.

The illustrated ramp 288 comprises an endless conveyor belt 302 having an upper run 304 extending lengthwise of the ramp. Belt 302 is driven by a motor (not shown) in a manner such that the upper belt run 304 moves in the downward direction of the ramp. A bridge 306 spans the gap between the assembly conveyor 48 and the upper run of the belt, as shown in FIG. 9. From this description, it will be understood that each solar cell stack 12 ejected from the assembly conveyor 48 onto the ramp conveyor 302 by the cell stack ejector 290 is transported downwardly on the ramp conveyor until its downward motion is arrested in the manner explained presently.

The outfeed conveyor 50 comprises an endless conveyor belt 307 extending laterally from the ramp conveyor 302 with the upper run 308 of the outfeed conveyor in the plane of the upper ramp conveyor run 304. A bridge 310 spans the gap between these runs. The outfeed conveyor belt 307 is driven by a motor (not shown) which moves the upper belt run 308 away from the ramp conveyor 302 and toward the adhesive curing station 32.

The cell stack group transfer means 292 comprises a linear actuator 312 including a cylinder 314 containing a plunger 316. Cylinder 314 is supported over the outfeed conveyor 50 by a pair of support bars 318 extending over and crosswise of the conveyor. These support bars are mounted at their ends on the conveyor housing 320 at opposite sides of the outfeed conveyor. The lower ends of the support bars in FIG. 1 are secured to an upstanding wall 322 of the housing which extends along the lower edge of the outfeed conveyor 50 and across the lower end of the ramp conveyor 302. Secured to the outer end of the actuator plunger 316 is a rake 324. Guide rods 326 secured to the ends of this rake extend through guides in the adjacent support bar 318.

Normally, the plunger 316 of the cell stack group rake actuator 312 is extended to its solid line position of FIG. 3. In this position, the rake 324 extends along the right hand edge of the ramp conveyor 302. Retraction of the plunger 316 moves the rake 324 to the left in FIG. 9 laterally across the ramp conveyor 302 and the bridge 310 to its broken line position over the adjacent end of the outfeed conveyor 50.

During operation of the solar cell glassing machine, the solar cell stacks 12, arriving at the conveyor transfer station 53 on the cell stack assembly conveyor 48, are ejected in succession with their assembly fixtures 36 by the cell stack ejector 290 from the assembly conveyor onto the ramp conveyor 302. Each cell stack and its fixture moves downwardly along the ramp 288 on the ramp conveyor until its motion is arrested, either by contact of the fixture with the lower housing wall 322, if it is the first on the ramp, or with a preceding fixture on the ramp. A group of cell stacks 12 and their fixtures 36 is thus formed along the ramp. After a selected number of cell stacks (in this instance five stacks) and their assembly fixtures have thus been collected on the ramp, the cell stack group transfer rake 324 is retracted to move the collected cell stack group laterally from the ramp conveyor 302 onto the outfeed conveyor 50. The rake is then returned to its solid line extended position to complete one cell stack transfer cycle. Between the assembly conveyor 48 and the ramp conveyor 302 is a gate 328 which is raised and lowered by an actuator 330. As explained below, this gate is normally raised when the cell stack group rake 324 is extended to its solid line position of FIG. 3 to permit transfer of cell stacks 12 and their assembly fixtures 36 from the assembly conveyor to the ramp conveyor. During retraction of the rake to transfer a group of cell stacks to the outfeed conveyor 50 and subsequent return of the rake to its extended position, the gate 328 is lowered to block entrance of cell stacks and their fixtures onto the ramp conveyor.

It will now be understood, therefore, that the outfeed conveyor 50 receives groups of solar cell stacks 12 and their assembly fixtures 36 from the cell stack assembly conveyor 48. These cell stack groups are transported in succession through the adhesive curing station 44 where their coverslide adhesive is cured by the adhesive curing means 44, such as an oven. As noted earlier, the outfeed conveyor 50 travels at a relatively slow speed to provide a pre-curing time delay sufficient to permit spreading of the coverslide adhesive over the entire cell faces by capillary action.

Figure 16A:
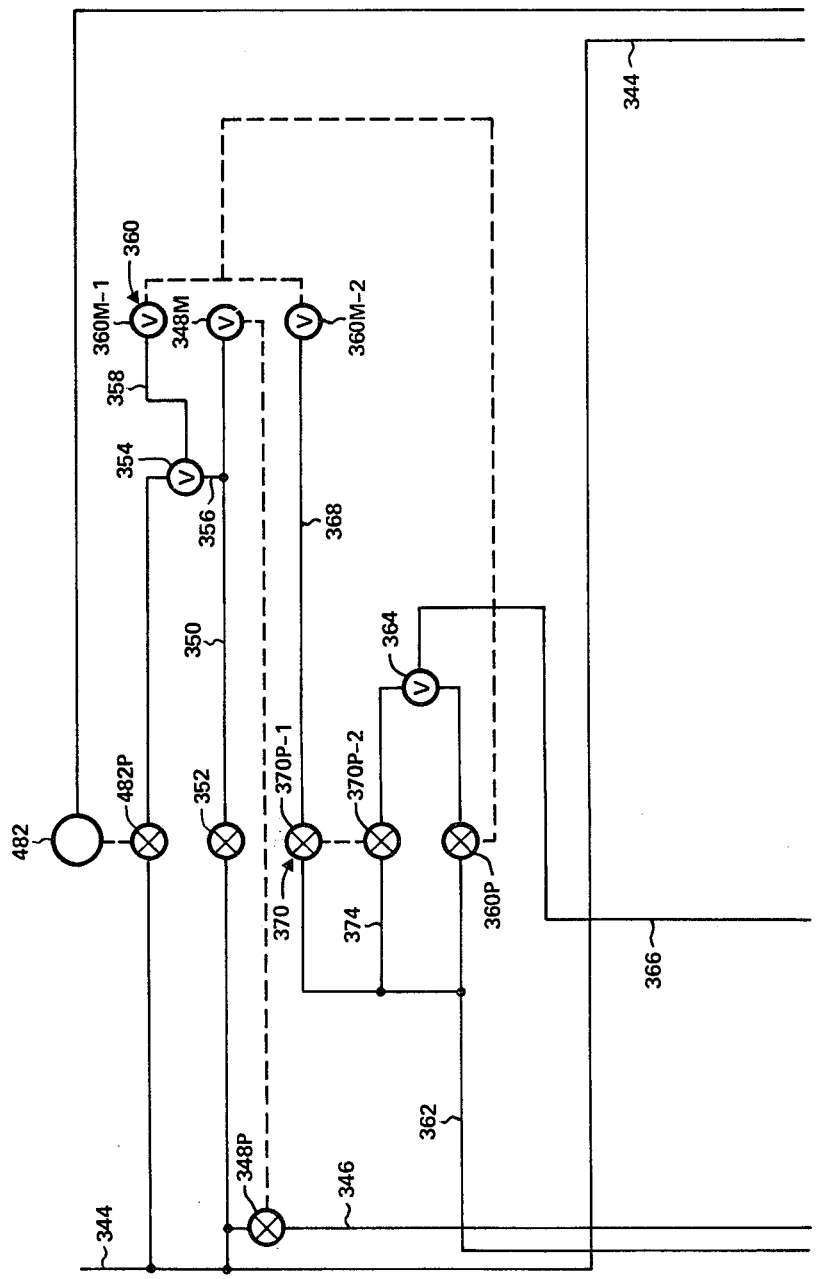
FIGS. 16a–16e schematically illustrate a control system for the machine.
Figure 16B:
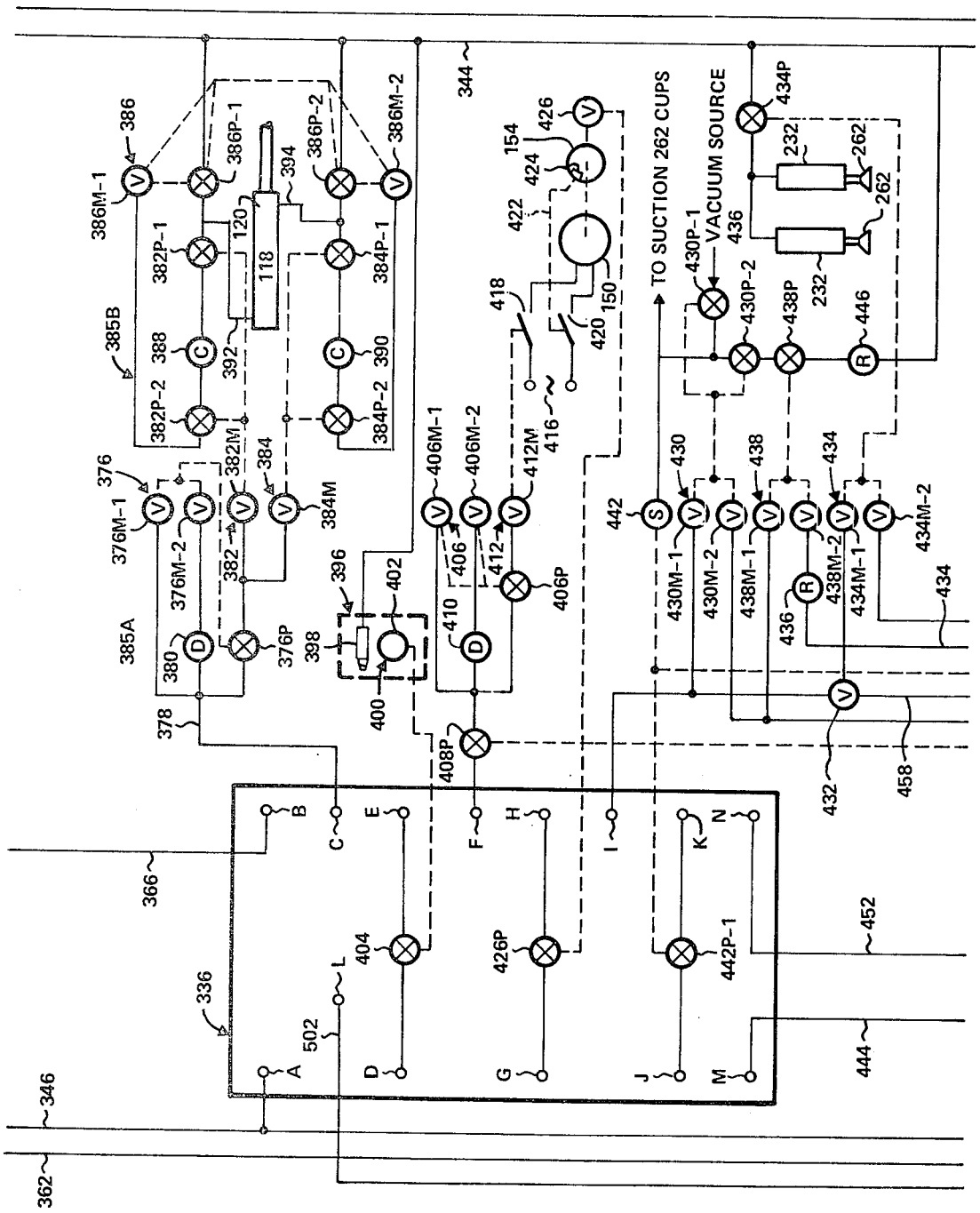
Figure 16C:
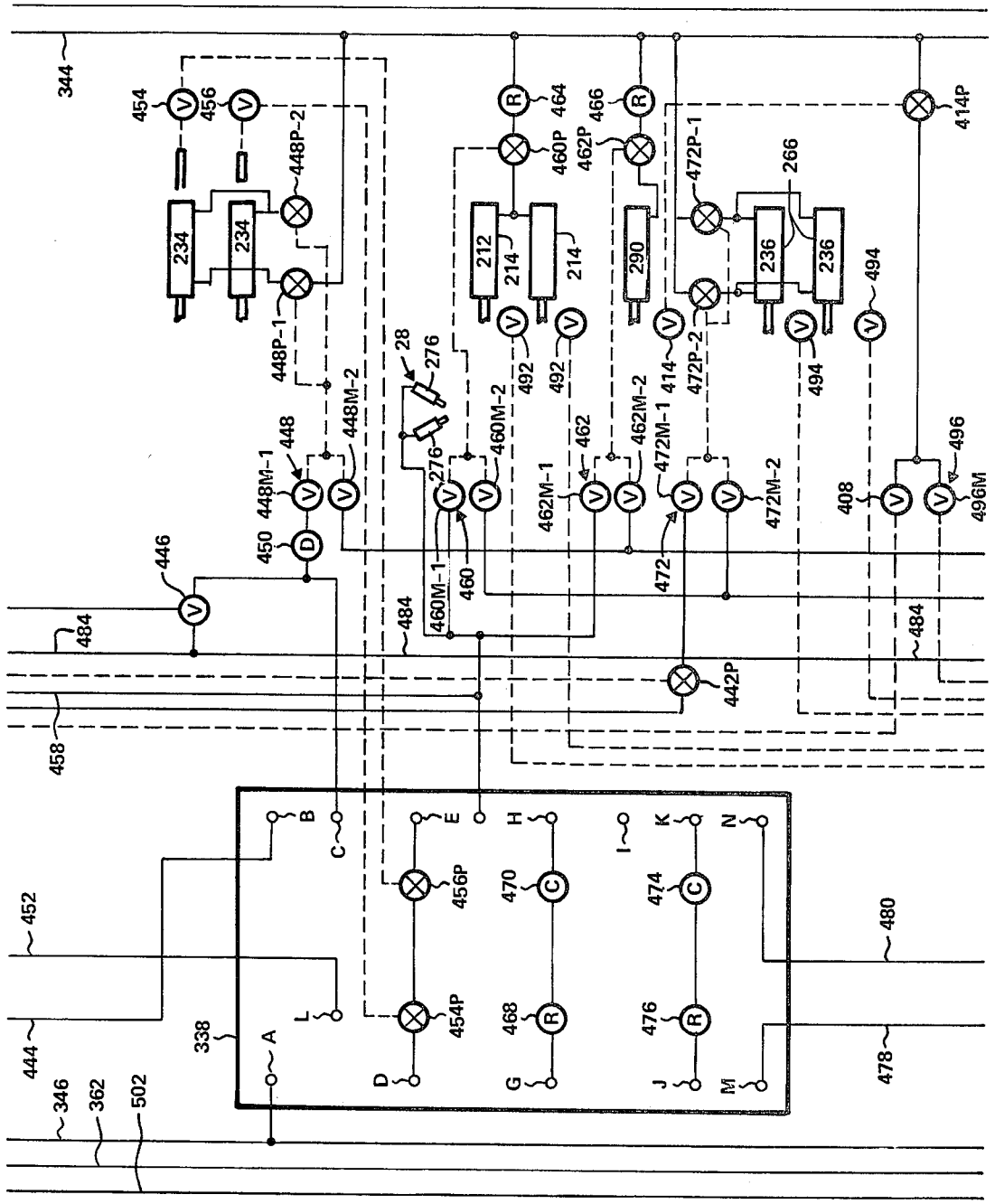
Figure 16D:
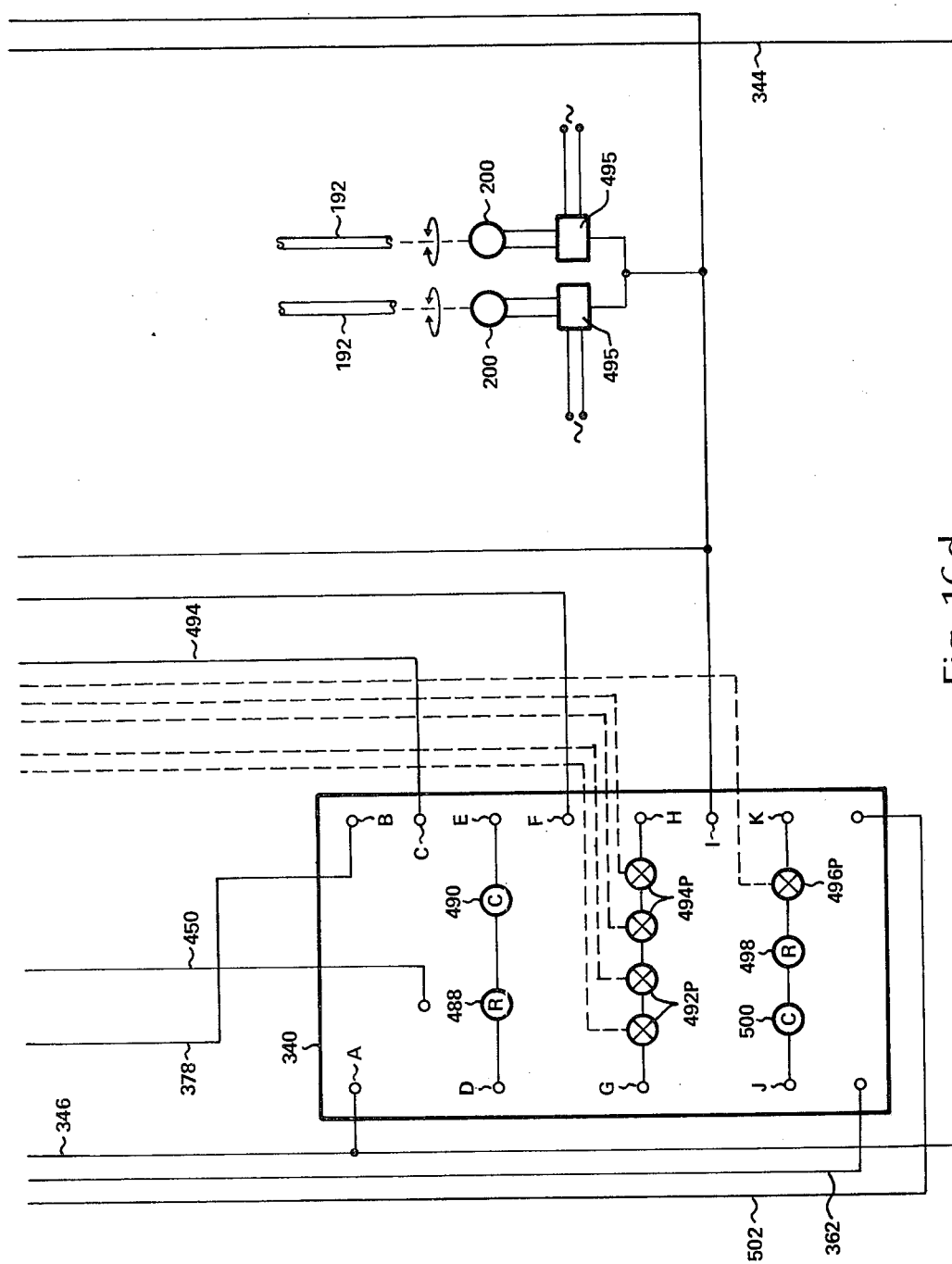
Figure 16E:
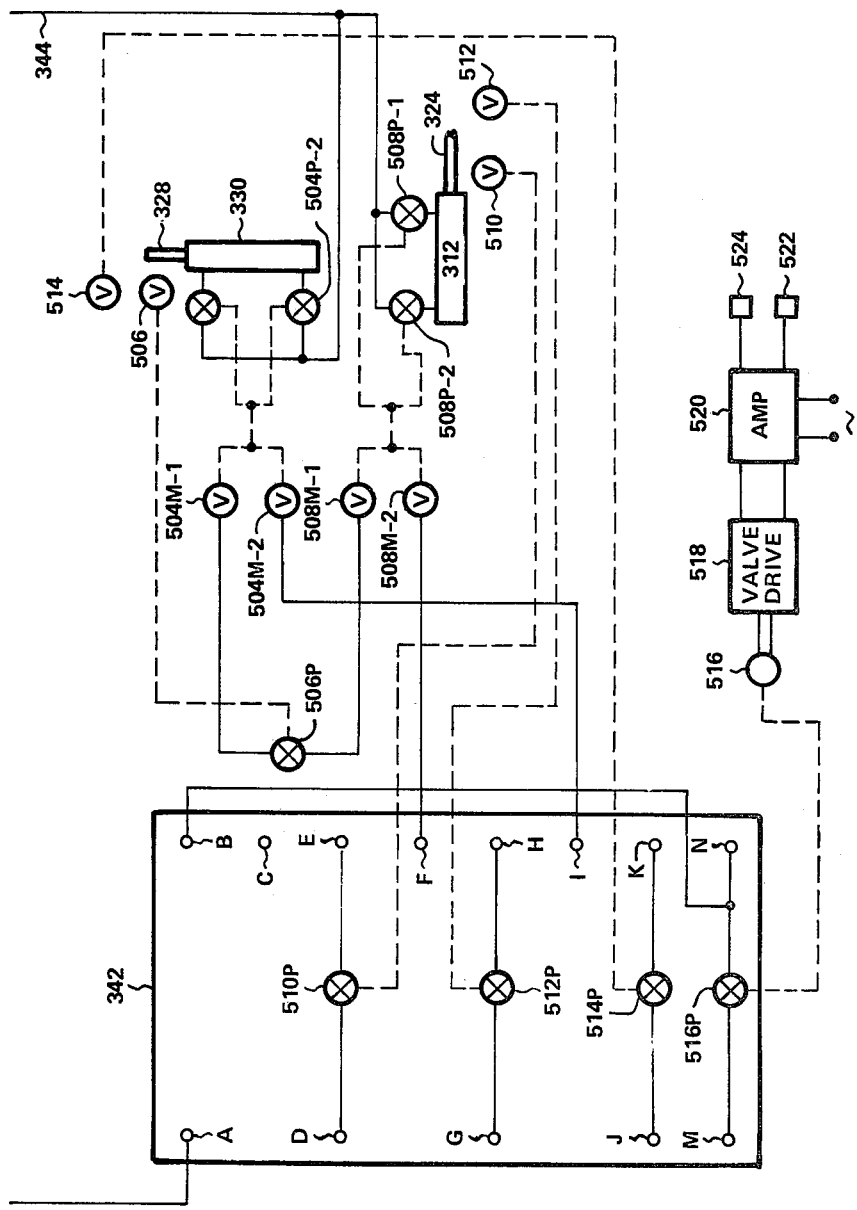

The over-all glassing machine operation will now be explained by reference to FIGS. 16a–16, illustrating an automatic control system 332 for the machine. A major portion of this control system is contained within housings 334 shown in FIG. 1. The preferred control system illustrated is a pneumatic control system comprising off-the-shelf pneumatic control components marketed by Dynamco Inc. of Dallas, Texas. It will become evident as the description proceeds, however, that the machine may utilize an electrical control system.

At the outset, it is significant to note that the illustrated pneumatic automatic control system 332 comprises four identical control modules 336, 338, 340 and 342, which are standard pneumatic control units marketed by Dynamco Inc. under the trademark "PROGRAM-AIR." Since these control modules are conventional, they need not be described in elaborate detail. Suffice it to say that each module is designed to effect or initiate a series of external events (in this instance, three agents) in sequence and, upon completion of the last event, to effect or initiate some other external event. Each module has a number of air ports designated by the letters A, B, C, D, E, F, G, H, I, J, K, L, M, and N and referred to herein as follows:

Port A: Air inlet or supply port.
Port B: Module activation port.
Port C: First event trigger port.
Ports D & E: First event completion interlock ports.
Port F: Second event trigger port.
Ports G and H: Second event completion interlock ports.
Port I: Third event trigger port.
Ports J & K: Third event completion interlock ports.
Port L: Initial external actuation signal port.
Port M: Final external actuation signal port.
Port N: Internal third event termination port.

The actual control modules have a few additional ports which are not used in this invention and hence have not been illustrated.

Briefly, operation of a control module is as follows:

Air supply port A is connected to an external source of air at regulated pressure. The remaining module ports B–N are normally unpressurized. A momentary air pressure trigger signal applied to the module activation port B from an external signal source effects internal (i.e., within the module) communication of the supply port A to the first event trigger port C, to the initial external actuation signal port L, and to the first event interlock port D, thereby pressurizing the latter three ports. Each event trigger port C, F, I will be connected to an external (i.e., outside the module) event air circuit for effecting a desired action (i.e., event) in response to pressurizing of the respective event trigger port. Each pair of interlock ports D,E G,H J,K will be connected to an external interlock air circuit for communicating the respective interlock ports in response to occurrence of the corresponding event.

Accordingly, application of an air pressure trigger signal to the module activation port A, effects initial occurrence of the first event or action to be produced by the module and subsequent communication of the respective interlock ports D,E in response to completion of the event. Communication of interlock ports D,E, in turn, effects pressurization of port E and this, in turn, actuates the module to vent the first event port C and to communicate the second event port F to and thereby pressurize the latter port from the supply port A.

Pressurizing of the second event trigger port F effects occurrence of a second desired external action or event. Completion of this second event will complete the external event interlock air circuit connecting the second event interlock ports G,H. This causes venting of the second event port F and connection of the third event trigger port I to and pressurizing of this port from the air supply port A.

Pressurizing of the third event trigger port I effects occurrence of a third desired external action or event. Completion of this third event will complete the external event interlock air circuit connecting the third event interlock air ports J,K to pressurize the port K. Pressurizing of this interlock port K actuates the module to internally communicate the supply port A to and thereby pressurize the final external actuation signal port M.

The initial and final external actuation signal ports L and M will be connected to external air circuits for triggering these circuits. In the case of module 338, for example, the initial signal port L is connected to the preceding module 336 and the final signal port M is connected to the following module 340 to terminate the third event of module 336 and activate the module 340, respectively.

The illustrated glassing machine control system 332 also enbodies a number of manually, mechanically, and/or pneumatically operated valves. For convenience of illustration, some of these valves are represented in the drawings by two separate symbols, namely a conventional valve symbol Ⓥ representing the manual, mechanical, and/or pneumatic valve operating mechanism and a valve symbol Ⓧ representing the valve passage means controlled by the valve mechanism. Each such valve is designated in its entirety by a basic reference numeral. The valve mechanism and valve passage means are designated by this basic reference numeral and the subscripts M and P, respectively. In some cases, the valve is a pilot valve whose valve operating mechanism has two separate pilot portions which are selectively pressurizable to effect operation of the valve to two different positions. In this case, the two pilot portions are represented by separate valve symbols Ⓥ and designated by the basic reference numeral for the valve and the subscripts M-1 and M-2, respectively. Each valve passage means has an open condition in which air flow can occur through the passage means to a downstream circuit and a closed condition in which air flow to the downstream circuit is blocked. As noted in the following description, the passage means of certain valves, when closed, vent the downstream circuit to atmosphere.

The machine control system 332 receives air under pressure through an air supply line 344. The air supply ports A of the four control modules 336, 338, 340, 342 are connected to this air supply line through an air line 346 and passage means 348P of an emergency stop valve 348. This stop valve is an air-latched, manually and pneumatically operable valve whose operating and air latching mechanism 348M is connected to the air supply line 344 through an air line 350 containing a manual reset valve 352 which is spring biased to closed position. The glassing machine is conditioned for operation by momentarily opening this reset valve. This momentary valve opening delivers air to the emergency stop valve mechanism 348M through air line 350 to operate the stop valve 348 to and latch this valve in its run position. In this run position, the emergency stop valve passage means 348P are open to supply pressure air from the air supply line 344 to the air supply port A of the control modules 336, 338, 340, 342. The emergency stop valve is manually operable to a stop position wherein its passage means 348P are closed to vent the air supply ports A of the control modules. Its air latching mechanism latches the valve in this stop position until it is returned to its run position by momentary closure of the reset valve 352.

Momentary opening of the reset valve 352 also supplies pressure air from the air supply line 344 to one end of a shuttle valve 354 through the air line 350 and an air line 356. This air pressure shifts the valve shuttle to a position wherein the pressure air passes from airlines 356 through the shuttle valve and an air line 358 to one pilot portion 360M-1 of a manually and pilot operated cycle stop valve 360. Cycle stop valve 360 is thereby operated to a single cycle position wherein its passage means 360P are open. Cycle stop valve passage means 360P are located in an air line 362 connecting the final external signal port M of the control module 340 to one end of a shuttle valve 364. This shuttle valve has a center outlet connected through an air line 366 to the activation port B of control module 336.

Cycle stop valve 360 has a second pilot portion 360M-2 connected to the final external signal port M of control module 340 through the air line 362 and an air line 368 containing passage means 370P-1 of a mode selector valve 370. This mode selector valve has passage means 370P-2 in an air line 374 connecting the other end of shuttle valve 364 to the latter module port M through the air line 362. Mode selector valve 370 has a normal position in which both of its passage means 370P-1 and 370P-2 are closed. This valve has an automatic mode position wherein its passage means 370P-1 are open to communicate the cycle stop valve pilot portion 360M-2 to the signal port M of control module 340 through air lines 368, 362. As will be explained later, port M is pressurized at this time. Opening of the mode selector valve passage means 370P-1 thus delivers pressure air to the cycle stop pilot portion 360M-2 to operate the cycle stop valve 360 to an automatic position wherein its passage means 360P are open to deliver pressure air from the port M through the shuttle valve 364 to the activation port B of control module 336. The mode selector valve has a single cycle position wherein its passage means 370P-2 are open to deliver pressure air from the port M of module 340 through shuttle valve 364 to the activation port B of control module 336.

Considering the operation of the glassing machine control system 232 as described to this point, the control system is conditioned for machine operation by momentary opening of the manual reset valve 352. This valve opening delivers pressure air from the air supply line 344 to the operating mechanism 348M of the emergency stop valve 348 and through the shuttle valve 354 to the pilot portion 360M-1 of the cycle stop valve 360. The emergency stop valve is thereby latched in its run position, wherein its passage means 348P are open to deliver pressure air from the supply line 344 to the air supply ports A of the four control modules 336, 338, 340, 342. The cycle stop valve 360 is then in its single cycle position wherein its passage means 360P is closed.

The next step in the control system operation involves momentary actuation of the mode selector valve 370 to either its automatic mode position or its single cycle position. Momentary operation of this valve to its automatic mode position opens the valve passage means 370P-1 to deliver pressure air to the cycle stop valve pilot portion 360M-2. The latter valve is thereby operated to its automatic mode position wherein the cycle stop valve passage means 360P is open to deliver pressure air from the port M of control module 340 through the latter valve passage means and shuttle valve 364 to the activation port B of the first control module 336 to condition the machine for automatic operation. Momentary operation of the mode selector valve 368 to its single cycle position delivers a pulse of pressure air from the port M of control module 340 through the mode selector valve and the shuttle valve 364 to the latter activation port B to condition the machine for single cycle operation. Thus, momentary operation of the mode selector valve 370 to either its automatic or single cycle position delivers an air pressure activation signal to the activation port B of the first control module 336.

As explained earlier, this activation signal triggers automatic operation of the control module 336 through a series of internal sequential actions to effect a series of external actions or events in a predetermined sequence. These external sequential actions involve (a) initial actuation of the fixture infeed mechanism 102 to dispense an assembly fixture 36 from the fixture magazine 68 to the assembly conveyor 48 (event 1), (b) following advancement of the assembly conveyor a distance equal to the center spacing between adjacent fixture holders 148 on the conveyor (event 2), and (c) final evacuation and lowering of the cell and coverglass suction cups 262 which are currently situated over solar cell and coverglass infeed positions $P_1$, respectively, to attach the cups by suction to a solar cell 14 and a coverglass 18 then located at these infeed positions (event 3).

To these ends, the first event port C of control module 336 is connected directly to one pilot portion 376M-1 of a spring biassed double pilot valve 376 through an air line 378, to the other pilot portion 376M-2 of valve 376 through a pneumatic delay means 380, and to the pilot portions 382M, 384M of a pair of spring biassed single pilot valves 382, 384 through passage means 376P of the double pilot valve 376. Pneumatic delay means 380, as well as the other pneumatic delays and timers referred to later, may comprise any suitable conventional pneumatic time delay and timing circuitry, such as an orifice alone, a volume chamber alone, a volume chamber and an orifice in flow series, or the like, depending upon the timing or time delay function required.

Pilot valve 376 is spring biassed to oppose the pressure in the valve pilot portion 376M-1 and to close the valve passage means 376P when the pressure is equalized in the two pilot portions 376M-1, 376M-2. Passage means 376P opens when the pressure in pilot portion 376M-1 exceeds the combined spring bias and pressure in pilot portion 376M-2. The above described components, starting with the pilot valve 376, collectively constitute an air valve system 385A. This air valve system controls a second air valve system 385B which, in turn, operates the escapement actuator 118 of the assembly fixture infeed mechanism 102 by normally pressurizing the rear end 120R of the escapement actuator cylinder 120 to normally retain the actuator plunger 116 extended and periodically pressurizing the front end 120F of the cylinder to retract the plunger. Each such plunger retraction operates the fixture infeed escapement mechanism 102 to feed an assembly fixture 36 to the assembly conveyor 48.

Air valve system 385B comprises a double pilot valve 386 having two opposing pilot portions 386M-1 and 386M-2. Pilot portion 386M-1 is connected to air supply line 344 through passage means 386P-1 of pilot valve 386, passage means 382P-1 and 382P-2 of pilot valve 382 and an accumulator chamber 388. Pilot portion 386M-2 is connected to air supply line 344 through passage means 386P-2 of pilot valve 386, passage means 384P-1 and 384P-2 of pilot valve 384, and an accumulator chamber 390. Air supply line 344 is connected to the rear end 120R of the escapement actuator cylinder 120 through the pilot valve passage means 386P-1 and an air line 392 and to the front end 120F of the cylinder through the pilot valve passage means 386P-2 and an air line 394.

Normally, the rear end 120R of the escapement actuator cylinder 120 and the accumulator chamber 388 are pressurized from the air supply line 344 through the pilot valve passage means 386P-1. The front cylinder end 120F is vented to atmosphere through the valve 386.

Pressurizing of the first event port C of control module 336 in response to an activation signal applied to its activation port B immediately pressurizes the pilot portion 376M-1 of pilot valve 376 to open its passage means 376P and after a time delay pressurizes its pilot portion 376M-2 to reclose its passage means 376P. During this timed opening of the passage means 376P, the pilot valves 382, 384 are pressurized to close their passage means 382P-1, 384P-2, and open their passage means 383P-2, 384P-1 against the spring bias of the valves. This action immediately pressurizes the pilot portion 386M-1 of pilot valve 386 from the accumulator chamber 388 to open the valve passage means 386P-2 and close the valve passage means 386P-1. At this time, the pilot portion 386M-2 of pilot valve 386 is vented to atmosphere through the valve 384. The front end 120F of the fixture infeed actuator cylinder 120 is then pressurized through the valve passage means 386P-2 and the rear cylinder end 120R is vented through valve 386 to retract the cylinder plunger 116 and thereby actuate the fixture infeed escapement mechanism 102 to dispense an assembly fixture 36 from the fixture magazine 68 to the assembly conveyor 48.

During this fixture dispensing action, both the pilot valve passage means 386P-2 and 384P-1 are open while the pilot valve passage means 384P-2 are closed. The accumulator chamber 390 is thereby pressurized from the air supply line 344.

The pneumatic delay means 380 is designed to delay pressurizing of the pilot portion 376M-2 of the double pilot valve 376 sufficiently long to permit this actuator plunger retraction and resulting fixture dispensing action. This delayed pressurization of the valve pilot portion 376M-2 following dispensing of an assembly fixture 36 to the assembly conveyor 48 recloses the valve passage means 376P and vents the pilot portions 382M, 384M of the pilot valves 382, 384 to atmosphere through the valve 376. The spring bias in the valves 382, 384 then recloses the valve passage means 382P-2, 384P-1 and reopens the valve passage means 382P-1, 384P-2. Reclosing of the passage means 384P-1 and reopening of the passage means 384P-2 pressurizes the pilot portion 386M-2 of pilot valve 386 to reopen its passage means 386P-1 and reclose its passage means 386P-2, the valve pilot portion 386M-1 then being vented through valve 382. The air valve system 385B is thus restored to its initial condition to return the plunger 116 of the fixture dispensing actuator 118 to its normal extended position in readiness for the next fixture dispensing cycle of the glassing machine.

The above assembly fixture dispensing cycle of the glassing machine constitutes the first event of the control module 336. This event is completed upon entrance of the assembly fixture being dispensed into its respective holder 148 of the assembly conveyor 48. This event completion is sensed by a sensor 396. In the drawings, this sensor comprises a pneumatic jet sensing system marketed by the Dynamco Co. mentioned earlier, including a nozzle vent 398 which directs an air jet toward the position occupied by an assembly fixture 36 properly situated in the assembly conveyor holder 148 currently in fixture receiving position at the fixture dispensing station, back pressure sensing means 400 for detecting the presence of a fixture in this latter position, including a sensor valve 402 having passage means 404 which open to communicate the first event completion interlock ports D and E of the control module 336 in response to such detection of a fixture in proper position on the conveyor.

It will now be understood that application of a pneumatic activation signal to port B of control module 336 causes pressurization of its first event port C to initiate a fixture dispensing cycle of the glassing machine. Proper completion of this cycle results in venting of the port C and pressurizing of the module second event port F to initiate the second event of the control module. This second event involves activation of the assembly conveyor drive means 150, 152 to advance the assembly conveyor 48 a distance equal to the center distance between adjacent assembly fixture holders 148 on the conveyor.

To this end, the second event port F of module 336 is connected to one pilot portion 406M-1 of a spring biassed double pilot valve 406 through passage means 408P of a spring biassed single pilot valve 408 and to the other pilot portion 406M-2 of valve 406 through the valve passage means 408P and a pneumatic delay means 410. Port F is also connected to the pilot portion 412M of a spring biassed single pilot valve 412 through the valve passage means 408P and passage means 406P of the double pilot valve 406.

Pilot valve 408 is pressurized against its spring bias to open its passage means 408P in response to retraction of the cell stack ejector 290 (FIG. 3). To this end, the valve pilot portion 408M is connected to the air supply line 344 through a spring biassed limit valve 414. This limit valve is opened by the cell stack ejector 290 to pressurize the valve pilot portion 408M and thereby open its passage means 408P when the ejector is retracted. The limit valve is spring biassed to close and vent the valve pilot portion 408M when the cell stack ejector extends to eject a solar cell stack 12 from the assembly conveyor 48. The spring bias of the pilot valve 408 then closes its passage means 408P to prevent advancement of the assembly conveyor 48 while the ejector is extended.

The double pilot valve 406 is spring biassed to oppose the pressure in its pilot portion 406M-1 and close its passage means 406P when the pressure is equalized in the valve pilot portions 406M-1 and 406M-2. A pressure in the valve pilot portion 406M-1 exceeding the combined valve spring bias and pressure in the valve pilot portion 406M-2 opens its passage means 406P.

The assembly conveyor drive motor 150 is energized from an electrical power source 416 through a pair of electrical switches 418, 420 arranged in electrical parallel. Switch 418 is actuated by the pilot valve 412 so that the switch opens when the valve pilot portion 412M is unpressurized and closes when this pilot portion is pressurized. Switch 420 has an operating arm 422 (FIG. 7) which rides on the edge of the Geneva drive wheel 154 to retain the switch closed except when the arm enters a notch 424 in edge. This notch allows the switch 420 to open and is aligned with the switch arm 422 when the Geneva drive 152 and, hence, the assembly conveyor 48 are at rest.

It will now be understood that assuming the cell stack ejector 290 is retracted, pressurizing of the second event port F of the control module 336 immediately pressurizes the pilot portion 406M-1 of pilot valve 406 to open its passage means 406P. After the time delay created by the pneumatic delay means 410, the valve pilot portion 406M-2 is also pressurized to reclose the passage means 406P. Accordingly, the pilot valve 412 is momentarily pressurized to momentarily close its switch 418. The assembly conveyor drive motor 150 is thereby energized, first through the pilot valve switch 418 and then through the Geneva wheel switch 420 which closes upon rotation of the wheel notch 424 away from the switch.

The time delay created by the delay means 410 is less than the time required for one revolution of the Geneva drive wheel 154. Accordingly, the pilot valve switch 418 reopens before the wheel completes one revolution. Reopening of the wheel switch 420 upon realignment of the wheel notch 424 with the switch thus de-energizes the conveyor drive motor 150 at the completion of one revolution of the Geneva drive wheel. During this single revolution, the assembly conveyor 48 is driven a distance equal to the spacing between adjacent assembly fixture holders 148 on the conveyor.

This conveyor drive cycle constitutes the second event of the control module 336. Completion of the event is sensed by a sensor 426 which, in this instance, is a limit valve having an operating arm 428 riding on the edge of the Geneva drive wheel 154. This limit valve is held closed by the wheel except when the wheel notch 424 is aligned with the valve arm 428 and allows the valve to open momentarily. Limited valve 426 is located at the side of the Geneva drive wheel opposite the wheel switch 420 and has passage means 426P connected between the second event interlock ports G, H of the control module 336. Accordingly, during the conveyor drive cycle described above, the limit valve 426 momentarily opens to communicate the latter interlock ports. This action effects venting of the second event port F, and hence the pilot valve 406, to atmosphere and pressurizing of the third event port I of the control module 336 to initiate its third event.

During this third event, the suction cups 262 of the solar cell and coverslide infeed or transfer means 162, 284 (FIG. 14) which are then extended over their respective cell and slide infeed positions $P_1, P_2$ are evacuated and lowered into contact with the underlying solar cell 14 and coverslide 18 currently in the infeed positions. To this end, the third event port I of the control module 336 is connected directly to one pilot portion 430M-1 of a double pilot valve 430 and through a shuttle valve 432 to one pilot portion 434M-1 of a double pilot valve 434. As will be explained presently, the remaining pilot portions 430M-2 and 434M-2 are connected to the third and first event ports, respectively, of the second control module 338.

Pilot valve 430 has passage means 430P-1 and 430P-2. A vacuum source 436 is connected through passage means 430P-1 to the suction cups 262 of both the solar cell and coverglass transfer means 162, 284. The suction cups are connected to the air line 344 through the valve passage means 430P-2, passage means 438P of a double pilot valve 438 to be discussed presently with regard to control modules 338, 340, and a pressure regulator 440. A vacuum sensor 442 is connected to the suction cups 262 also. Pilot valve passage means 430P-1 are opened and passage means 430P-2 are closed by pressurizing the pilot portion 430M-1 of the valve 430. Pressurizing pilot portion 430M-2 closes passage means 430P-1 and opens passage means 430P-2.

Pilot valve 434 has passage means 434P through which the air line 344 is connected to the upper ends of the solar cell and coverglass pickup and placement activators 232 (FIG. 14) of the solar cell and coverglass transfer means 162, 284. The plungers 250 of these actuators, which mount the suction cups 262, are spring biassed upwardly. The pilot valve passage means 434P are closed by pressurizing the valve pilot portion 434M-1 and opened by pressurizing the pilot portion 434M-2.

It will now be understood that pressurizing of the third event port 1 of control module 336 pressurizes the pilot portions 430M-1 and 434M-1 of the pilot valves 430, 434. The passage means 430P-1 of valve 430 are thereby opened and passage means 430P-2 are closed. Assuming the passage means 438P of the pilot valve 438 are closed at this time (which is true, as explained below), the vacuum source 436 is now connected to the suction cups to evacuate them. Simultaneously, the passage means 434P are opened to pressurize the upper ends of the solar cell and coverglass pickup and placement actuators 232 to extend the actuator plungers 250 downwardly against their upward spring bias for pressing their suction cups 262 against the solar cell 14 and coverglass 18 currently in their infeed positions $P_1$.

This suction cup evacuation and downward extension cycle constitutes the third and final event of the control module 336. The event is completed when the suction cups 262 are pressed against the solar cell and coverglass. Cycle completion is sensed by the vacuum sensor 442 which detects maximum vacuum in the suction cups when the latter are pressed firmly against the cell and coverslide. This vacuum sensor is essentially a pilot valve in which a pressure force created by the vacuum at the valve is balanced against an opposing standard spring and/or pressure force. This pilot valve sensor has normally closed passage means 442P-1 connecting the third event interlock ports J, K of module 336. Passage means 442P-1 open to communicate these ports and thereby terminate the third event of the latter module in response to detection of the maximum vacuum level mentioned above. This action effects venting of the third event port K and pressurizing of the final external actuation signal port M of module 336. Vacuum sensor 442 has normally open passage means 442P-2 connected to the second control module 338, as explained latter.

Signal port M of the first control module 336 is connected by an air line 444 to the activation port B of the second control module 338. Accordingly, completion of the third event of the first control module 336 activates the second control module 338 by transmission of an activation or pressure signal from the first module to the second module. The second control module then terminates the third event of the first control module 336 and resets the latter to its initial condition and effects the series of sequential external actions or events associated with the second module. In the case of the second module, these events involve initial elevation of the evacuated suction cups 262 to pick up the solar cell 14 and coverglass 18 from the initial infeed position $P_1$ followed by horizontal retraction of the suction cups (with the solar cell and coverglass) from their broken line extended cell/coverglass pick up positions to their solid line cell/coverglass placement positions of FIG. 14 over the assembly conveyor 48 wherein the solar cell overlies an empty assembly fixture 36 on the conveyor and the coverglass overlies an assembly fixture on the conveyor containing an adhesive bearing solar cell (event 1); lowering of the suction cups to place the solar cell on one cup onto the underlying fixture and the coverglass on the other cup onto the underlying adhesive coated solar cell (event 2) and final positioning of the solar cell on the empty fixture and the coverglass on the adhesive bearing solar cell followed by release of the suction cups from the cell and coverglass (event 3).

During event 2, the adhesive dispenser 28 is momentarily pressurized to dispense a small amount of adhesive to the then underlying solar cell on the assembly conveyor 48. Also, the solar cell and coverglass dispensers 44, 30 are operated to dispense a solar cell 14 and a coverglass 18 to the infeed positions $P_1$, and the cell stack ejector 290 is extended to eject the then aligned solar cell stack 12 on the assembly conveyor 48 from the latter to the outfeed conveyor 50.

To this end, the first event port B of the second control module 338 is connected to the pilot portion 434M-2 of pilot valve 434 through a shuttle valve 446 and to the pilot portion 448M-1 of a pilot valve 448 through a pneumatic time delay means 450. As explained later, valve 448 has a second pilot portion 448M-2 connected to the third event port of the third control module 340. The initial external actuation signal port L of the module 338 is connected through an air line 452 to the third event termination port N of the first control module 336.

Accordingly, activation of the second control module 338 by the activation pressure signal from the final signal port M of the first control module 336 produces at the port N of the second module a pressure signal which is applied to the third event termination port N of the first module to reset the latter to its initial condition and vent its third event port I. This activation of the second control module also pressurizes its first event port C and thereby the pilot portion 434M-2 of pilot valve 434 through the shuttle valve 446 and the pilot portion 448M-1 of pilot valve 448 through the time delay 450.

Pressurizing of the pilot portion 434M-2 of valve 434 closes its passage means 434P to cut off air pressure to the solar cell and coverglass pick up and placement actuators and vent these actuators. The actuator plungers 250 then retract upwardly by spring action to pick up from the infeed positions $P_1$ the solar cell 14 and coverglass 18 which are currently situated at these positions and held by suction to the pickup and placement suction cups 262.

This upward retraction of the actuators 232 occurs immediately upon pressurizing of the first event port C of control module 338 owing to the direct connection of this port to the actuator pilot valve 434. On the other hand, the pneumatic delay means 450 retards pressurizing of the pilot portion 448M-1 of valve 448. This delay is timed to permit complete or nearly complete upward retraction of the actuators before pressurization of the valve pilot portion 448M-1.

Pilot valve 448 has two passage means 448P-1 and 448P-2 connected between the air supply line 344 and the solar cell and coverglass transfer actuators 234. The airline 344 is connected to the front ends of the actuator cylinders 238 through the valve passage means 448P-1 and to the rear ends of these cylinders through the passage means 448P-2. Passage means 448P-1 open to effect retraction of the transfer actuator plungers 240 and passage means 448P-2 close to vent the rear ends of the actuator cylinders 238 when the valve pilot portion 448M-1 is pressurized. Passage means 448P-2 open to effect extension of the plungers 240 and passage means 448P-1 close to vent the front ends of the cylinders 238 when the valve pilot portion 448M-2 is pressurized.

It will now be understood, therefore, that the pressure signal produced at the first event port C of the second control module 338 in response to activation of this module by the first module 336 effects initial upward retraction of the pickup and placement actuators 232 to pick up a solar cell 14 and coverglass 18 from their respective dispensers 44, 30 and following horizontal retraction of the transfer actuators 234 to transport the solar cell and coverslide to positions over the assembly conveyor 48. As explained earlier, and will be discussed again presently, the cell now overlies an empty assembly fixture 36 and the coverglass overlies an adhesive bearing solar cell on the conveyor.

The above action constitutes the first event of the second control module which is completed upon arrival of the solar cell and coverglass transfer actuators 234 in their retracted positions. Completion of this first event is sensed by spring biassed limit valves 454, 456 having normally spring closed passage means 454P, 456P connected in series between the first event interlock ports D and E of the second control module 338. Limit valves 454, 456 are mounted on the rear ends of the transfer actuator cylinders 238, in the manner of limit valve 454 in FIG. 14 for actuation to open their passage means 454P, 456P by guide rods 254 of the transfer actuators 234 upon full retraction of their plungers 240. Thus, full retraction of these transfer actuators is signalled by opening of the limit valve passage means 454P, 456P to terminate the first event of control module 338 and initiate its second event by pressurizing its second event port F.

This second event port is directly connected through an air line 458 and the shuttle valve 432 to the pilot portion 434M-1 of pilot valve 434. Accordingly, the pressure signal at the second event port F pressurizes the latter pilot valve to open its passage means 434P and thereby repressurize the upper ends of the solar cell and coverglass pickup and placement actuators to extend downwardly its suction cups 262. This action lowers the solar cell 14 and coverglass 18 held by the suction cups onto the underlying empty assembly fixture 36 and adhesive bearing solar cell, respectively, currently located at the solar cell dispensing station 42 and coverglass dispensing station 24.

The second event port F of control module 338 is also connected in parallel to one pilot portion 460M-1 of a double pilot valve 460 and one pilot portion 462M-1 of a second pilot valve 462. These valves have second pilot portions 460M-2 and 462M-2 connected to the third control module 340, as explained below. Pilot valves 460, 462 have passage means 460P, 462P which open upon pressurizing of their pilot portions 460M-1, 462M-1 and close upon pressurizing of their pilot portions 460M-2, 462M-2. Air supply line 344 is connected in parallel to the rear ends of the cylinders 214 of the dispensing actuators 212 (FIG. 10) for the solar cell and coverglass dispensers 44, 30 through the pilot valve passage means 460P and a flow control 464 comprising an adjustable flow restriction in parallel with a reverse flow bypass check valve. Air supply line 344 is connected to the rear end of the cylinder 296 of the cell stack ejector actuator 294 (FIG. 3) through the pilot valve passage means 462P and a flow control 466 comprising an adjustable flow restriction with a reverse flow bypass check valve. Accordingly, the pressure signal at the second event port F of the control module 338 effects relatively slow extension of the dispensing ejector slides 220 to dispense a solar cell 14 and a coverglass 18 from their respective dispenser magazines 164 to their infeed positions $P_1$ and relatively slow extension of the cell stack ejector 298 to push from the assembly conveyor 48 onto the outfeed conveyor 50 the solar cell stack 12 currently situated at the transfer station 53.

Finally, the second event port F of control module 338 is connected to the adhesive containers 276 (FIG. 3a) through their air tubes 280. The pressure signal produced at the second event port thus pressurizes the adhesive containers to dispense adhesive from these containers onto the solar cell 14 then situated at the adhesive dispensing station 22.

It is now evident, therefore, that the pressure signal produced at the second event port F of control module 338 effects the following actions: (1) downward extension of the pickup and placement actuators 232 to lower the solar cell 14 and coverglass 18 held by the actuator suction cups 262 onto the underlying empty assembly fixture 36 on the assembly conveyor 48 at the solar cell dispensing station 42 and the underlying adhesive bearing solar cell on the conveyor at the coverglass dispensing station 24, respectively; (2) dispensation or ejection of a solar cell and a coverglass from their respective storage magazines to the infeed positions $P_1$; and (3) dispensation of adhesive from the containers 276 onto the underlying solar cell on the assembly conveyor at the adhesive dispensing station 22.

These actions constitute the second event of the control module 338 which is timed to terminate after a preset time period following initiation of the event by completion of the preceding first event. To this end, the second event interlock ports G and H of the second control module 338 are interconnected through a flow restriction 468 and a volume chamber 470. This flow restriction and volume together form a pneumatic timer which continues the second event for the period of time required for the pressure in the volume chamber and hence at the interlock port H to increase to the level necessary to actuate the internal pneumatic interlock circuitry of the module. This time period is present to provide a short pressure pulse to the adhesive applicators and permit completion of the second event.

Actuation of the internal second event interlock circuitry of the control module 338 at the end of this time period vents the second event port F and pressurizes the third event port I. Venting of port F vents the solar cell and coverglass dispensing actuators 212 and the cell stack ejector actuator 294, which then retract by spring action to their initial positions. The pickup and placement actuators 232 are not spring retracted and hence remain downwardly extended. Venting of the adhesive containers 276 through the port F terminates dispensing of adhesive.

The third event port I of control module 338 is directly connected to one pilot portion 438M-1 of the double pilot valve 438 and to the pilot portion 430M-2 of the double pilot valve 430. The latter event port is also connected to one pilot portion 472M-1 of a double pilot valve 472 through the normally open passage means 442P-2 of the suction cup vacuum sensor 442. Accordingly, the pressure signal produced at event port I immediately pressurizes the valve pilot portions 430M-2 and 438M-1 and pressurizes the valve pilot portion 472M-1 when the vacuum sensor passage means 442P-2 open. Valve 472 has a second pilot portion 472M-2 connected to the third control module 440, as explained below.

As described earlier, pilot valve 430 has passage mens 430P-1 which open and passage means 430P-2 which close to evacuate the solar cell and coverglass pickup and placement suction cups 262 when the valve pilot portion 430M-1 is pressurized. Pressurizing of the valve pilot portion 430M-2 closes the valve passage means 430P-1 to isolate the suction cups from their vacuum source 436 and simultaneously opens the valve passage means 430P-2 between the suction cups and the air supply line 344. At the same time, pressurizing of the valve pilot portion 438M-1 opens the valve passage means 438P, thereby conducting air under pressure from the airline 344 to the suction cups 262 and to the air nozzles 272. A positive pressure is thereby created in the suction cups which results in closing of the vacuum sensor passage means 442P-1 and opening of the vacuum sensor passage means 442P-2 to pressurize the valve pilot means 472M-1.

Valve 472 has passage means 472P-1 which open and passage means 472P-2 which close when the valve pilot means 472M-1 is pressurized. Passage means 472P-1 close and passage means 472P-2 open when the valve pilot portion 472M-2 is pressurized. The rear ends of the cylinders 266 of the solar cell and coverglass final positioning actuators 236 (FIG. 14) are connected to the air supply line 344 through the pilot valve passage means 472P-1. The front ends of these cylinders are connected to the air line 344 through the valve passage means 472P-2. Opening the passage means 472P-1 and closing the passage means 472P-2 pressurizes the rear ends of the actuators 236 and vents their front ends through the valve 472 to extend the solar cell and coverglass transfer assemblies 162, 284 in the manner described earlier. Similarly, closing the passage means 472P-1 and opening the passage means 472P-2 pressurizes the front ends and vents the rear ends of the final positioning actuators to retract the transfer assemblies 162, 284.

It is now evident, therefore, that the pressure signal produced at the third event port I of the second control module 338 effects the following actions: (a) cuts off the suction to the solar cell and coverglass pickup and placement suction cups 262; (b) pressurizes the suction cups and directs air under pressure against the solar cell 14 and coverglass 18 beneath the cups through the air nozzles 272; (c) pressurizes the solar cell and coverglass final positioning actuators 236 to extend their respective cell and coverglass transfer assemblies 162, 284. At this stage in the machine operation, the suction cups 262 are still extended downwardly and press firmly against their underlying solar cell and coverglass. Accordingly, extension of the transfer assemblies 162, 284 by the final positioning actuators 236 effects final edgewise positioning of the cell and coverglass against the locating pins 60 of their respective assembly fixtures 36 in the manner explained earlier.

These actions constitute the third event of the control module 338 which is timed to terminate after a preset time period following initiation of the event by completion of the preceding second event of the module. To this end, the third event interlock port J, which is pressurized upon completion of the second event, is connected to the third event interlock port K through a volume chamber 474 and a flow control 476 comprising an adjustable flow restriction with a reverse flow bypass check valve. This volume chamber and flow restriction together form a pneumatic timer which continues the third event for the period of time required for the pressure in the volume chamber 474 and hence at the interlock port K to increase to the level necessary to actuate the internal pneumatic interlock circuitry of the module. This time period is preset by adjustment of the flow restriction 476 to permit completion of the third event.

Actuation of the internal third event interlock circuitry of the control module 338 at the expiration of the preset time period for the third event pressurizes the final signal port M of the module. This pressure signal is transmitted through an air line 478 to the activation port B of the following third control module 340 to activate the latter and thereby pressurize its ports C and L. The resultant pressure signal produced at port L is transmitted through an air line 480 to the third event termination port N of the second control module 338 to terminate the third event of the latter module. This vents the third event port I of the second control module and resets the latter to its initial condition.

Activation of the third control module 340 by the pressure signal from the second control module 338 initiates the three external events of the third module. These events involve (a) initial upward retraction of the currently pressurized suction cups 262 by their pickup and placement actuators 232 followed by termination of air pressure to the suction cups and air nozzles 272 (event 1), (b) following retraction of the solar cell and coverglass dispensing slides 220 by their actuators 212 and retraction of the solar cell and coverglass transfer assemblies 162, 284 by the final positioning actuators 236 (event 2); and (c) final extension of the pickup and placement actuators 232 to the solar cell and coverglass infeed positions $P_1$ by their transfer actuators 234, retraction of the cell stack ejector 290 by its actuator 294, and actuation of a counter 482.

To this end, the first event port C of the control module 340 is connected through an air line 484 and the shuttle valve 446 to the pilot portion 434M-2 of the control pilot valve 434 for the solar cell and coverglass pickup and placement actuators 232. Event port C is also connected to the pilot portion 438M-2 of the pressure air control pilot valve 438 for the pickup and placement suction cups 262 through a flow control 486 comprising an adjustable flow restriction with a reverse flow bypass check valve.

The pressure signal produced at the first event port C of control module 340 thus immediately pressurizes the valve pilot portion 434M-2 to close the valve passage means 434P. The air pressure is then cut off to the upper ends of the pickup and placement actuators 232, and the latter are vented to atmosphere through the valve 434 to effect upward spring retraction of their suction cups 262. At this stage in the machine operation, air under pressure is still being supplied to the suction cups and the air nozzles 272 to hold the solar cell 14 and coverglass 18 beneath the cups firmly against their underlying assembly fixture 36 and adhesive bearing solar cell, respectively, as the suction cups retract upwardly by spring action. The flow control 486 delays pressurizing of the pilot portion 438M-2 of the suction cup/air nozzle pressure air control pilot valve 438 long enough to permit disengagement of the suction cups from the solar cell and coverglass. Subsequent pressurizing of the valve pilot portion 438M-2 then closes the valve passage means 438P to cut off the pressure air to the suction cups and nozzles.

The above actions constitute the first event of control module 340. This first event is timed to terminate after a preset time period following initiation of the event by the activation pressure signal from the preceding control module 338. To this end, the first event interlock ports D and E are connected through a flow restriction 488 and volume chamber 490 like those connecting the second event interlock ports G and H of control module 338. This flow restriction and volume chamber form a pneumatic timer which delays actuation of the internal first event pneumatic interlock circuitry for a present time period long enough to permit completion of the first event. Activation of this interlock circuitry at the expiration of this time period terminates the first event by venting the first event port B and pressurizing the second event port F of control module 340.

The second event port F is connected to the pilot portions 460M-2, 472M-2 of the control pilot valves 460, 472 for the solar cell and coverglass dispenser actuators 212 and final positioning actuators 236. The pressure signal produced at the port F thus pressurizes the latter valve pilot portions to effect retraction of the dispenser slides 220 and transfer assemblies 162, 284.

Completion of this second event of control module 340 is sensed by a pair of limit valves 492 which are actuated to open their normally closed passage means 492P upon retraction of the dispenser slides 220 by their actuators 212 and a pair of limit valves 494 which are actuated to open their normally closed passage means 494P upon retraction of the transfer assemblies 162, 284 by the final positioning actuators 236. The second event interlock ports G, H of the second control module 340 are connected through the limit valve passage means 492P, 494P in series. Accordingly, opening of all these passage means by retraction of the dispenser slides and transfer assemblies terminates the second event by venting the second event port F and pressurizing the third event port I.

The third event port I of control module 340 is connected to electro-pneumatic controls 495 for the magazines' feed motors 200 of the solar cell and coverglass dispensing means 160, 282. These controls are actuated by the pressure signal produced at port I upon initiation of the third event of the module to energize the feed motors 200 in such a way that the latter drive their lead screws 192 through a predetermined angle in response to each actuation of the controls. The lead screw thread pitch, in turn, is designed so that successive rotations of the lead screws through this angle elevate their dispenser magazines 164 the proper distance to align the successive solar cell and coverglass in the magazines with their respective dispenser slides 220. Controls 495 may be similar to the control for the assembly conveyor drive motor 150 or comprise any other conventional control means for the purpose described.

The third event port I of control module 340 is also connected to the pilot portions 448M-2 and 462M-2 of the control pilot valves 448, 462 for the solar cell and coverglass transfer actuators 234 and to the cell stack ejector actuator 290. The pressure signal produced at the third event port upon initiation of the third event of control module 340 thus pressurizes the latter pilot valve portions 448M-2 and 462M-2 to open the valve passage means 448P-2 and close the passage means 448P-1 of the cell stack ejector control pilot valve 448, and to close the valve passage means 462P. The solar cell and coverglass transfer actuators 234 are thereby pressurized to extend their pickup and placement actuators 232 to the solar cell and coverglass infeed positions $P_1$, $P_2$. Simultaneously, the air pressure to the rear end of the cell stack ejector 294 is cut off and the latter is vented to atmosphere through valve means 462 to effect spring retraction of the cell stack ejector 298. One limit valve 492 also has passage means 492P-2 which open to connect holes 492A in the solar cell and coverglass dispenser platforms 196 within the infeed positions P-1, P-2 to a vacuum source for retarding the cells and coverglasses as they are fed to these positions by cell and coverglass ejectors.

The third event port I of control module 340 is also connected to the counter 482. This counter is conventional and hence need not be described in elaborate detail. Suffice it to say that the counter is a presettable air actuated counting device for counting successive pressure signals applied to the device and having normally closed passage means 482P which open when the preset count is reached. The device may be preset to open its passage means 482P at any desired total count within its range. The pressure applied to counter 482 from the third event port I of control module 340 during each three event cycle of the module constitutes one pressure signal to the counter which actuates the latter to register a count as will appear from the over-all description, each such count represents a completed cell stack 12. In the automatic mode of the glassing machine, the counter 482 is preset to a desired cell stack production count, and when this production count is attained, the counter passage means 482P open to pressurize the pilot portion 360M-1 of the cycle stop pilot valve 360 through the shuttle valve 354. This closes the cycle stop valve passage means 360P to terminate operation of the glassing machine.

The above actions of elevating the solar cell and coverglass dispenser magazines 164 to align their next cell 14 and coverglass 18 with their ejector slides 220, extending the solar cell and coverglass pickup and placement devices 232, 262 to the cell and coverglass infeed positions $P_1$, retracting the cell stack ejector 298, and actuating the cell stack counter 482 to register a count constitutes a third event of control module 340. Termination of this third event is initialed by opening of the limit valve 414 by the cell stack ejector 298 upon its return to its retracted position of FIG. 3.

To this end, the pilot portion 496M of a spring biassed pilot valve 496 is connected to the air supply line 344 through the limit valve 414 in parallel with the pilot portion 408M of pilot valve 408 discussed earlier. Accordingly, return of the cell stack ejector 298 to its retracted position effects pressurizing of both pilot valves 408 and 496. As explained earlier, pressurizing of pilot valve 408 opens its normally closed passage means 408P against the valve spring bias to permit actuation of the Geneva drive mechanism 152 to drive the assembly conveyor 48 upon pressurizing of the second event port F of the first control module 336.

Pilot valve 496 has normally closed passage means 496P. The third event interlock ports J and K of the third control module 340 are connected through this passage means, a flow restriction 498, and a volume chamber 500. Flow restriction 498 and volume chamber 500 form a pneumatic timer. From this it will be understood that retraction of cell stack ejector 298 closes its limit valve passage means 496P to effectively start the timer 498, 500. This timer then delays actuation of the internal third event pneumatic interlock circuitry of the control module 340 until the pressure in the volume chamber 500, and hence at the interlock port K, increases to the level required to effect this interlock actuation.

This actuation of the internal third event interlock circuitry of control module 340 pressurizes its final signal port M. As explained earlier, this port is connected to the activation port B of the first control module 336 and to the pilot portion 360M-2 of the cycle stop pilot valve 360 as follows. The final signal port M is connected to the first control module activation port B through the air line 362, the cycle stop valve passage means 360P, and the shuttle valve 364 as well as through the parallel flow path from the air line 362 through the single cycle mode passage means 370P-2 of the mode selector valve 370 and the shuttle valve 364 to the activation port B. The final signal port M of the third control module 340 is connected to the pilot portion 360M-2 of the cycle stop valve 360 through the air line 362 and the automatic mode passage means 370P-1 of the mode selector valve 370. The third event termination port N of the third control module 340 is connected through an air line 502 to the initial external signal port L of the first control module 336. Accordingly, the pressure signal produced at the latter port upon activation of control module 336 by application of a pressure signal to its activation port B terminates the third event of the third control module 340 by venting its third event port I.

From the description to this point, it will be understood that operation of the present solar cell glassing machine is initiated by initial momentary closure of the air on valve 352 and following momentary actuation of the mode selector valve 370 to either its single cycle or automatic mode positions. Momentary closure of the air on valve 352 pressurizes the emergency stop valve 348 to open its passage means 348P and thereby supply air under pressure from the air supply line 344 to the air supply ports A of the four control modules 336, 338, 340, 342. Momentary closure of the air-on valve also pressurizes the pilot portion 360M-1 of the cycle stop valve 360 to open its passage means 360P.

At this point, the final external signal port M of the third control module 340, and hence the air line 362 connecting the latter port to the cycle stop valve passage means 360P and the mode selector valve passage means 370P-1, 370P-2 are pressurized. Accordingly, momentary actuation of the mode selector valve 370 to its single cycle position momentarily closes its passage means 370P-2 and thereby delivers a pressure pulse to the activation port B of the first control module 336. The first three control modules 336, 338, 340 then proceed in sequence through the cycle described thus far to effect the several sequential events involved in the glassing machine operation. Pressurizing of the final external signal port M of the third control module 340 delivers air pressure to the cycle stop valve passage means 360P and mode selector valve passage means 370P-1, 370P-2. Since all of these passage means are now closed, the machine stops. Repetition of the machine operation just described requires momentary actuation of the mode selector valve 370 to its single cycle position again. Thus, each actuation of the mode selector valve to this position effects operation of the glassing machine through one sequence or cycle of the described machine operating events.

Assume now that the mode selector valve 370 is momentarily actuated to its automatic position. In this case, the mode selector valve passage means 370P-1 closes temporarily to connect the pressurized air line 362 from the third control module 340 to, and thereby pressurizes, the pilot portion 360M-2 of the cycle stop pilot valve 360. This action opens the cycle stop valve passage means 360P, which then remains open until closed by pressurizing of the cycle stop valve pilot portion 360M-1 in the manner explained below. Air under pressure from the pressurized air line 362 is now conducted through the valve passage means 360P and shuttle valve 364 to the activation port B of the first control module 336. The glassing machine then proceeds through the same cycle of machine operating events as in the single cycle mode of machine operation. However, since the passage means 360P of the cycle stop valve 360 remains open in the automatic mode, the air pressure produced in the air line 362, upon completion of the third event of the third control module 340, again pressurizes the activation port B of the first control module 336 to automatically repeat the cycle of described machine operating events.

This automatic machine operation continues until terminated in either of the following ways. Normal termination of the automatic machine operation occurs by opening of the passage means 482P of the counter 482 when the latter registers its preset production count. Opening of the counter passage means pressurizes the cycle stop valve pilot means 360M-1 from the air supply line 344 through the shuttle valve 354. This action closes the cycle stop valve passage means 360P to prevent activation of the first control module 336 by the air pressure in line 362 upon completion of the third event of the third control module 340. As noted earlier, each count of the counter 482 represents a completed solar cell stack 12. Thus, the glassing machine may be preset by presetting the counter, to produce a given number of cell stacks and then stop.

Automatic operation of the glassing machine may be terminated at any time by manually closing the passage means 348P of the emergency stop valve 348 to cut off the air supply to the four control modules 336, 338, 340, 342. It will be recalled that this valve is a combination pilot and manually operated valve whose passage means 348P may be closed manually. The valve pilot portion 348M is pressurized at the start of machine operation to open the passage means 348P, should it be closed, by momentary opening of the air on valve 352. The emergency stop valve 348 is detented so that its passage means 348P remains open until closed manually and then remains closed until reopened by pressurizing of the valve.

Turning now to the fourth and final control module 342, the latter, when activated by application of a pressure signal to its activation port B, initiates its series of three sequential events. These events involve initial lowering of the cell stack transfer gate 328 to a lower closed position to block ejection of solar cell stacks 12 from the assembly conveyor 48 onto the cell stack transfer ramp 288 at the cell stack transfer station 53 and following retraction of the cell stack transfer rake 324 to transfer a group or column of cell stacks 12 and their assembly fixtures from the ramp 288 onto the outfeed conveyor 50 (event 1); return of the rake 324 to its normal extended position (event 2); and final raising of the transfer gate 328 to its upper open position to permit transfer of additional solar cell stacks 12 from the outfeed conveyor 48 to the transfer ramp 288 by the cell stack ejector 290 (event 3).

In contrast to the first three control modules 336, 338, 340, which are activated by a pressure signal from another control module, the fourth control module 324 activates itself to repeat its series of three sequential events upon completion of the third event. To this end, the final signal port M of the fourth module is connected to the module activation port B in the manner explained below to apply an activating pressure signal to the module at the completion of its third event.

The first event port C of control module 342 is connected to one pilot portion 504M-1 of a control pilot valve 504 for the cell stack transfer gate 328. This valve has a second pilot portion 504M-2 connected to the third event port I of the module. Opposite ends of the cylinder of the transfer gate actuator 330 are connected to the air supply line 344 through passage means 504P-1 and 504P-2, respectively, of the valve 504. Pressure to the valve pilot portion 504M-1 opens the valve passage means 504P-1 and closes passage means 504P-2 to pressurize the transfer gate actuator 330 in a direction to lower the transfer gate 328 from its solid line open position to its broken line closed position of FIG. 9. Pressure to the valve pilot portion 504M-2 opens the valve passage means 504P-2 and closes passage means 504P-1 to pressurize the gate actuator in a direction to raise the transfer gate to its open position.

The transfer gate 328 operates a normally spring biassed limit valve 506 to open its passage means 506P against the valve spring bias upon arrival of the gate at its lower closed position. The first event port C of control module 342 is connected through this limit valve passage means 506P to one pilot portion 508M-1 of a control pilot valve 508 for the cell stack transfer rake 324. Valve 508 has a second pilot portion 508M-2.

The front and rear ends of the transfer rake actuator cylinder 314 are connected to the air supply line 314 through passage means 508P-1 and 508P-2, respectively, of the pilot valve 508. Pressure to the pilot portion 508M-1 opens the passage means 508P-1 and closes the passage means 508P-2 to retract the transfer rake 324 from its solid line extended position to its broken line retracted position of FIG. 3. Pressure to the pilot portion 508M-2 opens the passage means 508P-2 and closes the passage means 508P-1 to extend the rake to its extended position.

It will now be understood that the pressure signal produced at the first event port C of control module 342 when the latter is activated by a pressure signal at its activation port B, effects initial lowering of the cell stack transfer gate 328 to its closed position and following retraction of the cell stack transfer rake 324 to its broken line retracted position of FIG. 3. As noted earlier and explained in more detail presently, each such retraction of the rake transfers a group of solar cell stacks 12 on their assembly fixtures 36 from the transfer ramp 288 to the outfeed conveyor 50.

The above actions constitute the first event of the fourth control module 342. Completion of this event is sensed by a spring biased limit valve 510 (FIG. 3) mounted on the overhead support 318 for the rake actuator 312 and having normally spring closed passage means 510P connecting the first interlock ports D and E of the fourth control module 342. Upon its arrival at its broken line retracted position of FIG. 3, the cell stack transfer rake 324 actuates the limit valve 510 to open its passage means 510P against the valve spring bias and thereby communicate the interlock ports D and E. This action terminates the first event by venting the first event C and pressurizing the second event port F.

This second event port F of control module 342 is connected to the pilot portion 508M-2 of pilot valve 508. As noted above, pressure to this valve pilot portion opens the valve passage means 508P-2 and closes the valve pilot means 508P-1 to extend the cell stack transfer rake 324. Accordingly, the pressure signal produced at the second event port F effects extension or return of the rake from its broken line position to its normal solid line position of FIG. 3. This rake return constitutes the second event of the control module.

Completion of this second event is sensed by a spring biassed limit valve 512 (FIG. 3) having normally spring closed passage means 512P connecting the second event interlock ports G and H of the fourth control module 342. Upon its arrival at its solid line extended position, the cell stack transfer rake 324 actuates the limit valve 512 to open its passage means 512P against the valve spring bias and thereby communicate the interlock ports G and H. This action terminates the second event by venting the second event port F and pressurizing the third event port I of the fourth control module.

Third event port I is connected to the pilot portion 504M-2 of the control pilot valve 504 for the cell stack transfer gate 328. As explained above, pressurizing of this valve pilot portion effects raising of the gate to its solid line open position of FIG. 9. Accordingly, the pressure signal produced at the third event port I of control module 342 raises the gate to its open position, which action constitutes the third event of the control module.

Completion of this third event is sensed by a spring biassed limit valve 514 having normally spring closed passage means 514P connecting the third event interlock ports J and K of control module 342. The transfer gate 328 actuates this valve to open its passage means upon return of the gate to its upper open position. The interlock ports J and K are thereby placed in communication through the limit valve to pressurize the final signal port M of the control module.

This final signal port of control module 342 is connected to the activation port B and the third event termination port N of the same module through normally spring closed passage means 516P of a solenoid valve 516. Solenoid valve 516 is operated by a valve driver 518 controlled by a sensor amplifier 520 which, in turn, is controlled by a pair of photocells 522, 524. These photocells are located on the cell stock transfer ramp 288 alongside the ramp conveyor 302 and operate in concert to detect the presence on the ramp of a predetermined number of cell stack bearing assembly fixtures 36. The photocells are exposed to ambient illumination through windows in the ramp.

In this regard, it will be recalled from the earlier description that during the glassing machine operation, cell stacks 12 are ejected in succession from the assembly conveyor 48 onto the transfer ramp 288 by the cell stack transfer ejector 290. When a predetermined number of these fixtures have accumulated on the ramp, the cell stack transfer rake 324 is retracted to move the resulting group 526 of fixtures laterally from the ramp onto the outfeed conveyor 50. In the case of the illustrated solar cell glassing machine, the assembly fixtures are transferred from the ramp to the outfeed conveyor in groups of five assembly fixtures each, and the photocells 522, 524 are arranged to detect the presence of five assembly fixtures 36 on the ramp.

To this end, these photocells are located in the path of downward movement of the assembly fixtures 36 along the ramp 288 assembly conveyor 48. Accordingly, during its downward movement along the ramp, each fixture moves over the photocells in procession. The spacing between the photocells is greater than the corresponding edgewise width of the fixtures so that a single fixture will not cover both photocells simultaneously. The positioning of the photocells along the ramp is such that the penultimate assembly fixture 36 in a fixture group 526 on the ramp 288 (i.e., the fourth fixture from the bottom in FIG. 15) will overlie the photocell 522 and the fifth or top fixture in the group will overlie the photocell 524. Under these conditions, the assembly fixtures block ambient light transmission to both photocells simultaneously. The driver 518 and amplifier 520 for the solenoid valve 516 are designed to open the valve passage means 516P under these conditions and thereby apply a pressure signal from the final signal port M of the fourth control module 342 to its third event termination port N for terminating the just completed third event of the module and to its activation port B to effect repetition of its three sequential events described above.

It will now be understood, therefore, that during operation of the present solar cell glassing machine, solar cell stack bearing assembly fixtures 36 are ejected in succession from the assembly conveyor 48 onto the cell stack transfer ramp 288. The first assembly fixture in each fixture group 526 is carried downwardly along the ramp by the ramp conveyor 302 until the motion of the fixture is arrested by contact of the latter with the upstanding wall or stop 322 at the lower end of the conveyor. Thereafter, the conveyor belt merely slides across the underside of the fixture. This same action is repeated for each succeeding assembly fixture in a group except that each succeeding fixture is arrested by the preceding fixture.

As it moves downwardly along the ramp 288, each assembly fixture 36 crosses the photocells 522, 524, but covers only one photocell at a time. Similarly, the next-to-the-last assembly fixture (i.e., the fourth fixture in FIG. 15) in each fixture group 526, when arrested on the ramp by the preceding fixture, covers the photocell 522 but not the photocell 524. Accordingly, the transfer gate 328 remains open and the transfer gate 324 remains extended. Photocell 524 is covered by the last assembly fixture (i.e., fifth fixture in FIG. 15) upon its arrival at its final position at the top of the group. Both photocells 522, 524 are now covered simultaneously to effect opening of the solenoid valve passage means 516P.

This action produces, at port M of control module 342, a pressure signal which is applied to both ports N and B of the module. The pressure signal applied to port N terminates the third event of the module. The pressure signal applied to port B activates the module to execute its series of three sequential events involving initial lowering of the cell stack transfer gate 328 to its closed position to block entrance of another cell stack bearing assembly fixture 36 onto the transfer ramp 288, (b) following retraction of the transfer rake 324 to move the just completed fixture group 526 laterally from the ramp onto the outfeed conveyor 50, (c) return of the rake to its extended position, and (d) final return of the gate to its open position to permit entrance of the following assembly fixtures onto the ramp to form the next fixture group.

Figure 15:
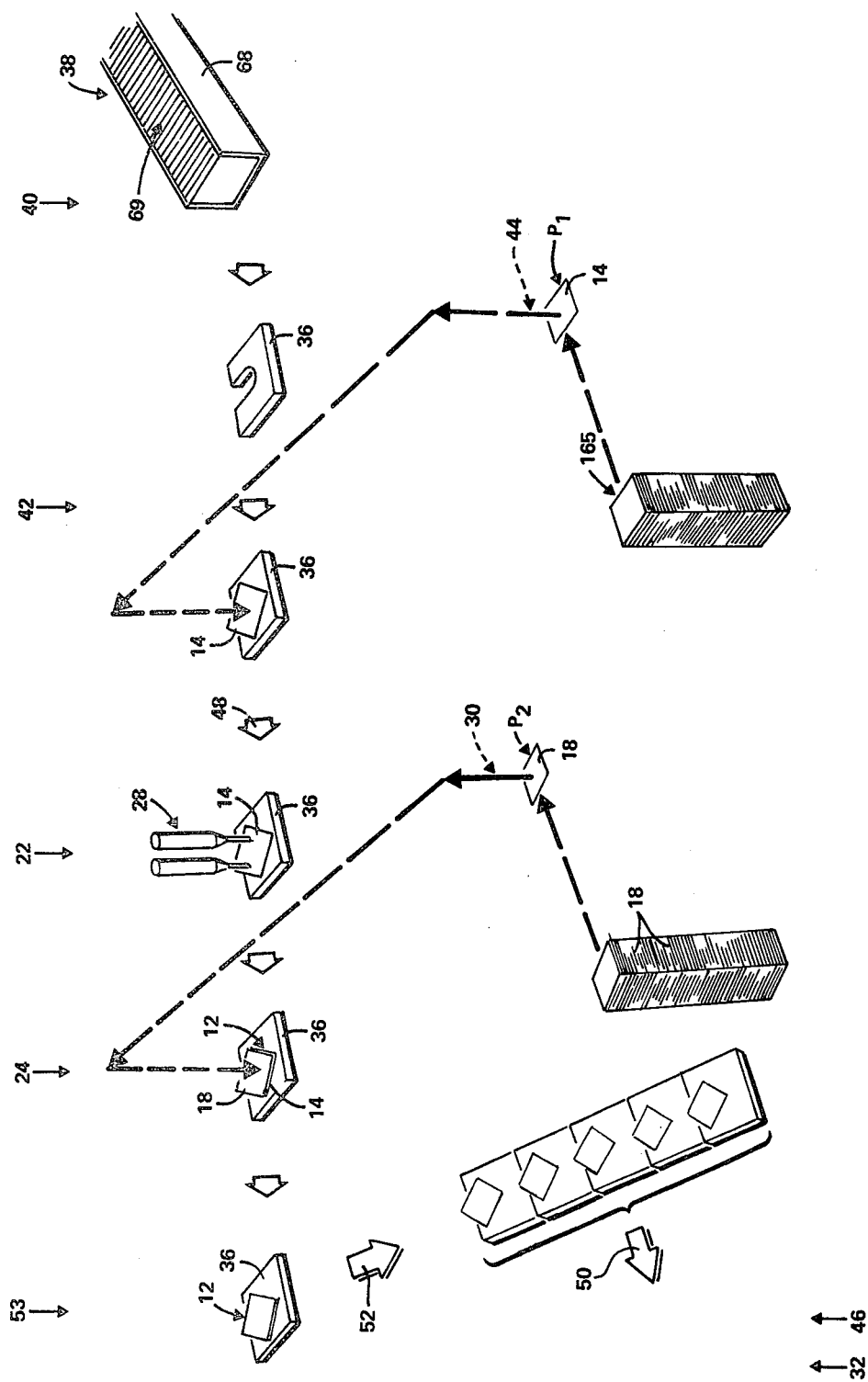
FIG. 15 diagrammatically depicts the machine operation.

The over-all glassing machine operation will now be summarized by reference to FIG. 15. The cell stack assembly conveyor 48 is driven intermittently and receives assembly fixtures 36 in succession from the fixture dispensing means 38. The conveyor transports the fixtures through the solar cell dispensing station 42, the adhesive dispensing station 22, and the coverglass dispensing station 24 to the cell stack transfer station 53.

Each assembly fixture 36 receives a solar cell 14 at the cell dispensing station 42 from the solar cell dispensing means 44. At the following adhesive dispensing station 22, the upper face of each cell receives a small amount of liquid adhesive from the adhesive dispensing means 28. A coverglass 18 is applied to the adhesive bearing face of each cell at the coverglass dispensing station 24 to form a cell stack 12.

At the cell stack transfer station 53, the cell stacks 12 are transferred from the assembly conveyor 48 to the outfeed conveyor 50 in groups 526. This conveyor transports the cell stack groups through the adhesive spreading station 46 and then through the final adhesive curing station 32. During movement of the cell stacks through the station 46, the liquid adhesive applied to the solar cells spreads by capillary action over the entire cell faces. The adhesive is then cured at the curing station 32 to provide completed solar cell stacks.

We claim:

1. A solar cell glassing machine, comprising:
   adhesive dispensing means for applying adhesive to the faces of solar cells,
   cover glass dispensing means for applying a cover-glass to each cell face,
   means for effecting relative movement of solar cells past said dispensing means and operating said dispensing means in timed relation to apply adhesive and then a coverglass to the face of each cell to form an adhesively bonded cell stack, and means for positively aligning each coverglass relative to its respective solar cell 2. The machine of claim 1 wherein:
   said adhesive is a liquid adhesive which is applied to the central region only of each cell face and thereafter spreads by capillary action over the entire cell face.

3. The machine of claim 2 wherein:
   said machine includes means for curing said adhesive of each cell stack after a time delay following application of the coverglass to the respective solar cell sufficient to permit capillary spreading of the adhesive over substantially the entire cell face.

4. The machine of claim 1, wherein:
   each coverglass has slightly larger edgewise dimensions than its solar cell and is placed on the cell in a centered position where the glass edges project slightly beyond the cell edges.

5. A solar cell glassing machine, for fabricating a solar cell stack having a coverglass adhesively bonded to the face of a solar cell, comprising:
   cell stack assembly means for receiving a solar cell and coverglass in assembled relation,
   solar cell dispensing means,
   adhesive dispensing means,
   coverglass dispensing means, and
   means for effecting relative movement of said assembly means past said dispensing means and operation of said dispensing means in timed relation to first place a solar cell on said assembly means, then apply adhesive to the cell face, and thereafter place a coverglass on cell face to form an adhesively bonded cell stack.

6. The machine of claim 5 wherein:
   said assembly means includes locating means engageable with the edges of the solar cell and coverglass to align the cell and coverglass, and
   said solar cell and coverglass dispensing means urge the cell and coverglass edgewise against said locating means.

7. The machine of claim 6 wherein:
   said coverglass has slightly larger edgewise dimensions than said solar cell, and
   said locating means comprises upstanding, conically tapered, locating pins on said assembly means, whereby edgewise contact of said locating pins by the solar cell and coverglass on the assembly means aligns the cell and glass with the glass projecting edgewise slightly beyond the cell edges.

8. A solar cell glassing machine for fabricating solar cell stacks each having a coverglass adhesively bonded to the face of a solar cell, comprising:
   conveyor means movable through solar cell, adhesive, and coverglass dispensing stations,
   solar cell dispensing means at said cell dispensing station for dispensing solar cells onto said conveyor means, whereby the cells are transported through said adhesive and coverglass dispensing stations,
   adhesive dispensing means at said adhesive dispensing station for applying adhesive to the face of each solar cell passing through the latter station, and
   coverglass dispensing means at said coverglass dispensing station for applying a coverglass to the adhesive bearing face of each solar cell passing through the latter station to form an adhesively bonded solar cell stack.

9. The machine of claim 8 wherein:

said adhesive dispensing means applies liquid adhesive to a central region only of each solar cell face, and said machine includes an outfeed zone through which each cell unit moves on said conveyor means after leaving said coverglass dispensing station to permit spreading of the adhesive by capillary action over substantially the entire face of the respective solar cell.

10. The machine of claim 9 wherein:
said machine includes means adjacent the end of said outfeed zone for curing said adhesive.

11. The machine of claim 9 wherein:
said conveyor means comprises means for transporting individual solar cells in succession past said adhesive and coverglass dispensing stations and thereafter transporting adhesively bonded cell stacks in groups through said outfeed zone.

12. The machine of claim 11 wherein:
said machine includes means adjacent the end of said outfeed zone for curing said adhesive.

13. The machine of claim 8 wherein:
said machine includes cell stack assembly fixtures movable on said conveyor means and each adapted to receive a solar cell and a coverglass at said cell and coverglass dispensing stations, respectively, and hold the respective bonded cell stack.

14. The machine of claim 13 wherein:
each assembly fixture includes locating means engageable with the edges of its respective solar cell and coverglass to align the cell and coverglass.

15. The machine of claim 14 wherein:
said coverglass of each cell stack has slightly larger edgewise dimensions than the respective solar cell, and said locating means on each assembly fixture comprises upstanding, conically tapered locating pins disposed for contact with the edges of the solar cell and coverglass on the fixture to align the cell and glass with the glass projecting edgewise slightly beyond the cell edges.

16. The machine of claim 13 wherein:
said adhesive dispensing means applies liquid adhesive to a central region only of each solar cell face, said machine includes an outfeed zone beyond said coverglass dispensing station, and said conveyor means comprises means for transporting individual assembly fixtures in succession through said adhesive and coverglass dispensing stations, whereby each fixture receives a solar cell and coverglass forming a cell stack, and thereafter transporting the fixtures with their contained bonded cell stacks in groups through an outfeed zone to permit spreading of the adhesive by capillary action over substantially the entire cell faces.

17. The machine of claim 16 wherein:
said conveyor means comprises an assembly conveyor for transporting said assembly fixtures in succession through said dispensing stations, an outfeed conveyor for transporting said fixtures in groups through said outfeed zone, and transfer means for transferring said fixtures in groups from said assembly conveyor to said outfeed conveyor.

18. The machine of claim 13 wherein:
said machine includes assembly fixture dispensing means for feeding fixtures in succession to said conveyor means in advance of said solar cell dispensing means.

19. The machine of claim 8 wherein:
said adhesive dispensing means applies liquid adhesive to a central region only of each solar cell face, said machine includes an outfeed zone beyond said coverglass dispensing station, and said conveyor means comprises means for transporting individual solar cells in succession through said adhesive and coverglass dispensing stations, whereby each cell receives adhesive and then a coverglass to form a cell stack, and thereafter transporting the stacks in groups through an outfeed zone to permit spreading of the adhesive by capillary action over substantially the entire cell faces.

20. The machine of claim 19 wherein:
said conveyor means comprises an assembly conveyor for transporting solar cells in succession through said adhesive and coverglass dispensing stations, an outfeed conveyor for transporting said cell stacks in groups through said outfeed zone, and transfer means for transferring said cell stacks in groups from said assembly conveyor to said outfeed conveyor.

21. A solar cell glassing machine, comprising:
conveyor means movable through solar cell, adhesive, and coverglass dispensing stations, solar cell dispensing means at said cell dispensing station for feeding solar cell members in succession to said conveyor means, whereby the cell members are transported in succession through said adhesive and coverglass dispensing stations, adhesive dispensing means at said adhesive dispensing station for applying adhesive to the face of each solar cell member passing through the latter station, coverglass dispensing means at said coverglass dispensing station for applying a coverglass member to the adhesive bearing face of each solar cell member passing through the latter station to form an adhesively bonded solar cell stack, and each of said cell and coverglass dispensing means comprises a storage means for containing a stack of the respective members, and a dispensing mechanism operable in timed relation to movement of said conveyor means for feeding the respective members in succession from said stack onto said conveyor means if the dispensed members are solar cell members and from said stack onto solar cell members on said conveyor means if the dispensed members are coverglass members.

22. The machine of claim 21 wherein:
each said storage means comprises a storage magazine for containing said stack of members to be dispensed, and each said dispensing mechanism comprises means for ejecting members in succession from the respective magazine to an infeed position, and transfer means for transporting each member from its infeed position to said conveyor means or to a solar cell member on said conveyor means, as the case may be.

23. The machine of claim 22 wherein:
each said ejecting means comprises an ejector blade movable back and forth along a direction line passing through the respective infeed position, and means for stepping said magazine lengthwise of its contained stack across said direction line whereby said blade moves back and forth through said magazine to eject members from said magazine to their infeed position, and each said transfer means comprises suction cup means, means for moving said cup means along a first path between a member pickup positions opposite the respective infeed position and a member placement position opposite said conveyor means, and means for evacuating and pressurizing said cup means and extending and retracting said cup means in timed relation to movement of the cup means between said pickup and placement positions to pick up a member from the respective infeed position and deposit the member on the conveyor means or on a solar cell on the conveyor means, as the case may be.

* * * * *